(12) United States Patent
Shibazaki

(10) Patent No.: US 9,921,490 B2
(45) Date of Patent: Mar. 20, 2018

(54) SUBSTRATE HOLDING DEVICE, EXPOSURE APPARATUS, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/033,327

(22) PCT Filed: Oct. 29, 2014

(86) PCT No.: PCT/JP2014/078713
§ 371 (c)(1),
(2) Date: Aug. 8, 2016

(87) PCT Pub. No.: WO2015/064613
PCT Pub. Date: May 7, 2015

(65) Prior Publication Data
US 2016/0370712 A1    Dec. 22, 2016

(30) Foreign Application Priority Data
Oct. 30, 2013 (JP) ................................. 2013-224843

(51) Int. Cl.
*B23B 5/34* (2006.01)
*G03B 27/58* (2006.01)
(Continued)

(52) U.S. Cl.
CPC .......... *G03F 7/70716* (2013.01); *G03F 7/707* (2013.01); *G03F 7/70733* (2013.01); *H01L 21/68742* (2013.01)

(58) Field of Classification Search
CPC .. G03F 7/707; G03F 7/70716; G03F 7/70733; H01L 21/68742
(Continued)

(56) References Cited

U.S. PATENT DOCUMENTS 4,780,617 A    10/1988  Umatate et al.
5,448,332 A    9/1995   Sakakibara et al.
(Continued)

FOREIGN PATENT DOCUMENTS

EP    1 420 298 A2    5/2004
JP    2007277702 A  * 10/2007
(Continued)

OTHER PUBLICATIONS

Jan. 20, 2015 International Search Report issued in International Patent Application No. PCT/JP2014/078713.
(Continued)

*Primary Examiner* — Colin Kreutzer
(74) *Attorney, Agent, or Firm* — Oliff PLC

(57) ABSTRACT

A substrate holding device is equipped with a substrate holder that adsorbs and holds a substrate, and a plurality of vertical movement pin units that each have, at one end, an adsorption section to adsorb a rear surface of the substrate, and are movable relative to the substrate holder in a state of adsorbing the rear surface of the substrate with the adsorption section. The plurality of vertical movement pin units each have at least part including the adsorption section that is displaced in at least one direction, by an action of a force received from the adsorbed substrate.

30 Claims, 13 Drawing Sheets

(51) Int. Cl.
*G03B 27/60* (2006.01)
*H02K 41/02* (2006.01)
*G03F 7/20* (2006.01)
*H01L 21/687* (2006.01)

(58) Field of Classification Search
USPC .................. 279/3; 310/12.06; 355/72, 73
See application file for complete search history.

(56) References Cited

U.S. PATENT DOCUMENTS

| | | | |
|---|---|---|---|
| 5,646,413 A | 7/1997 | Nishi | |
| 5,669,977 A * | 9/1997 | Shufflebotham | G03F 7/707 |
| | | | 118/500 |
| 5,933,943 A | 8/1999 | Chou | |
| 5,969,441 A | 10/1999 | Loopstra et al. | |
| 6,208,407 B1 | 3/2001 | Loopstra | |
| 6,341,007 B1 | 1/2002 | Nishi et al. | |
| 6,400,441 B1 | 6/2002 | Nishi et al. | |
| 6,515,261 B1 * | 2/2003 | Smargiassi | C23C 16/4586 |
| | | | 118/50.1 |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,624,433 B2 | 9/2003 | Okumura et al. | |
| 6,710,857 B2 | 3/2004 | Kondo | |
| 6,952,253 B2 | 10/2005 | Lof et al. | |
| 7,023,610 B2 | 4/2006 | Ohtsuki et al. | |
| 2003/0025890 A1 | 2/2003 | Nishinaga | |
| 2004/0207824 A1 | 10/2004 | Lof et al. | |
| 2006/0261288 A1 | 11/2006 | Van Santen | |
| 2008/0068580 A1 | 3/2008 | Mori et al. | |
| 2011/0236162 A1 | 9/2011 | Shikayama et al. | |

FOREIGN PATENT DOCUMENTS

| | | | |
|---|---|---|---|
| JP | 2008235472 A | * | 10/2008 |
| JP | 2013-191601 A | | 9/2013 |
| KR | 20070119386 A | * | 12/2007 |
| WO | 2004/055803 A1 | | 7/2004 |

OTHER PUBLICATIONS

Jan. 20, 2015 Written Opinion of the International Searching Authority issued in International Patent Application No. PCT/JP2014/078713.

Mar. 14, 2017 Extended Search Report issued in European Patent Application No. 14858776.9.

Dec. 6, 2017 Office Action issued in Taiwanese Patent Application No. 103137775.

* cited by examiner

SUBSTRATE HOLDING DEVICE, EXPOSURE APPARATUS, AND DEVICE MANUFACTURING METHOD

TECHNICAL FIELD

The present invention relates to substrate holding devices, exposure apparatuses and device manufacturing methods, and more particularly to a substrate holding device that holds a tabular substrate, an exposure apparatus equipped with the substrate holding device as a holding device of a substrate to be exposed, and a device manufacturing method that uses the exposure apparatus.

BACKGROUND ART

Conventionally, for example, in a lithography process for manufacturing semiconductor devices, projection exposure apparatuses of a sequential-movement-type, such as a reduction projection exposure apparatus of a step-and-repeat method (a so-called stepper) or a scanning-type projection exposure apparatus of a step-and-scan method (a so-called scanning stepper (which is also called a scanner)), are mainly used.

In the projection exposure apparatuses of this type, a wafer stage that is movable within a two-dimensional plane is provided, and a wafer is held by vacuum adsorption or electrostatic adsorption or the like, by a wafer holder fixed on the wafer stage.

While various types of the wafer holders are available, wafer holders by a pin chuck method are relatively frequently used. Further, on the wafer stage, three vertical movement pins (also referred to as center-ups or lift pins) for delivering a wafer onto the wafer holder are provided (e.g., see PTL 1). The vertical movement pins vertically move via an opening formed at the wafer holder, and receive a wafer from a carrier arm above the wafer holder and deliver the wafer onto the wafer holder by moving downward in a state of adsorbing and holding the wafer.

However, with increasing the integration degree of semiconductor devices and the size of wafers, it has come to be found that distortion that cannot be ignored occurs in the center portion of a wafer that is delivered from the vertical movement pins to the wafer holder.

CITATION LIST

Patent Literature

[PTL 1] U.S. Pat. No. 6,624,433

SUMMARY OF INVENTION

Solution to Problem

The cause that the distortion remains in the wafer center portion as described above was thought as follows. That is, after withdrawal of the carrier arm, the outer peripheral edge portion of the wafer that is supported by the vertical movement pins hangs downward, and when vacuum suction of the wafer is performed by the wafer holder along with the downward movement of the vertical movement pins, the adsorption is started from the peripheral portion of the wafer and is gradually directed toward the center, and as a result, the distortion remains the center portion of the wafer after the adsorption.

However, as a result of the experiments and the like performed thereafter, it has been found that even if the suction by the wafer holder is first started from the center portion of the wafer, the distortion still remains in the wafer center portion. Therefore, after further considerations, the inventor has arrived at the present invention that contributes to solving the problem that the distortion of the center portion of the wafer occurs.

According to a first aspect of the present invention, there is provided a substrate holding device that holds a substrate, the device comprising: a substrate holding section on which the substrate is adsorbed and held; and a plurality of movable members that each have an adsorption section to adsorb a rear surface of the substrate, at one end, the plurality of movable members being movable relative to the substrate holding section in a state of adsorbing the rear surface of the substrate with the adsorption section, wherein at least one movable member of the plurality of movable members has at least part that is displaced in at least one direction, by an action of a force received from the adsorbed substrate, the at least part including the adsorption section.

With this device, for example, when a substrate whose rear surface is adsorbed by adsorption sections of a plurality of movable members is mounted on a substrate holding section, the substrate is changed in shape (planarized) by being adsorbed by the substrate holding section, and at least part of at least one movable member is displaced in at least one direction by receiving the force from the substrate so that the change in shape of the substrate is not hindered. Consequently, the occurrence of distortion in a surface of the substrate caused by the adsorption by the plurality of movable members is suppressed.

According to a second aspect of the present invention, there is provided a substrate holding device that holds a substrate, the device comprising: a substrate holding section on which the substrate is adsorbed and held; and a plurality of movable members that each have one end including an adsorption section to adsorb a rear surface of the substrate and the other end on an opposite side to the one end, the plurality of movable members being each movable relative to the substrate holding section in a state of adsorbing the rear surface of the substrate with the one end, wherein at least one movable member of the plurality of movable members is provided with a displacement section that is disposed between the one end and the other end and is displaced in at least one direction by an action of a force received from the substrate.

With this device, for example, when a substrate whose rear surface is adsorbed by adsorption sections of a plurality of movable members is mounted on a substrate holding section, the substrate is changed in shape (planarized) by being adsorbed by the substrate holding section, and at least a displacement section of at least one movable member is displaced in at least one direction by receiving the force from the substrate so that the change in shape of the substrate is not hindered. Consequently, the occurrence of distortion in a surface of the substrate caused by the adsorption by the plurality of movable members is suppressed.

According to a third aspect of the present invention, there is provided an exposure apparatus that exposes a substrate with an energy beam, the apparatus comprising: the substrate holding device of the first aspect or the second aspect, that holds the substrate on the substrate holding section; and a pattern generating device that generates a pattern on the substrate by exposing the substrate with the energy beam.

According to a fourth aspect of the present invention, there is provided a device manufacturing method, including:

exposing a substrate using the exposure apparatus of the third aspect; and developing the substrate that has been exposed.

DESCRIPTION OF EMBODIMENTS

An embodiment of the present invention will be described below, based on FIGS. 1 to 10B.

Figure 1:
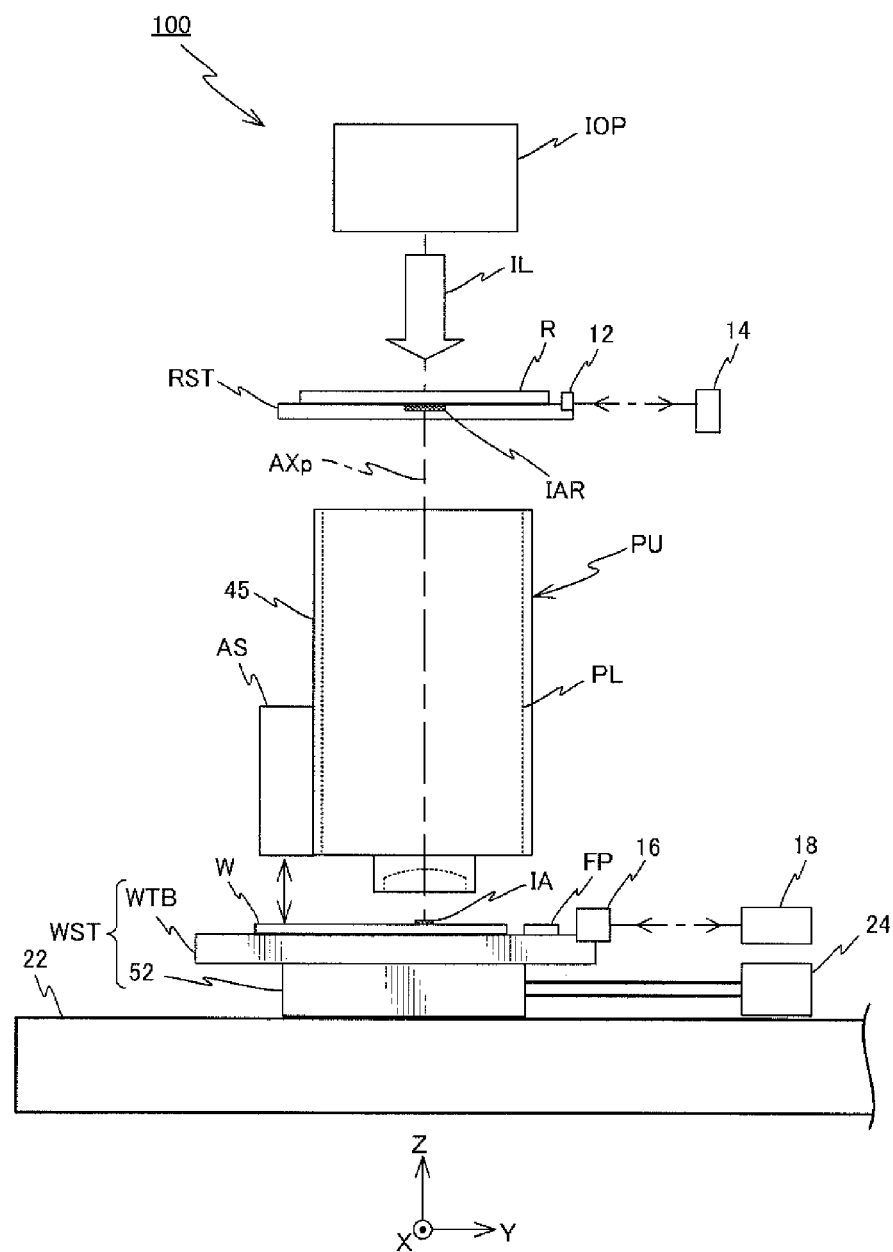
FIG. 1 is a view schematically showing a configuration of an exposure apparatus related an embodiment.

FIG. 1 shows a schematic configuration of an exposure apparatus 100 related to the embodiment. Exposure apparatus 100 is a projection exposure apparatus of a step-and-scan method, which is a so-called scanner. As will be described later, in the present embodiment, a projection optical system PL is provided, and in the description below, the explanation is given assuming that a direction parallel to an optical axis AXp of projection optical system PL is a Z-axis direction, a scanning direction in which a reticle and a wafer are relatively scanned within a plane orthogonal to the Z-axis direction is a Y-axis direction, a direction orthogonal to the Z-axis and the Y-axis is an X-axis direction, and rotation (tilt) directions around the X-axis, the Y-axis and the Z-axis are θx, θy and θz directions, respectively.

Exposure apparatus 100 is equipped with an illumination system IOP, a reticle stage RST that holds a reticle R, a projection unit PU that projects an image of a pattern formed on reticle R on a wafer W that is coated with sensitive agent (resist), a wafer stage WST that holds wafer W and moves within an XY plane, a control system thereof, and the like.

Illumination system TOP includes a light source and an illumination optical system that is coupled with the light source via an light transmitting optical system, and Illumination system IOP illuminates an illumination area IAR having a slit-like shape elongated in the X-axis direction (a direction orthogonal to the page surface of FIG. 1) on reticle R defined (set) by a reticle blind (a masking system) with illumination light (exposure light) IL with substantially uniform illuminance. The configuration of illumination system IOP is disclosed in, for example, U.S. Application Publication No. 2003/0025890 and the like. Herein, as illumination light IL, ArF excimer laser beam (with a wavelength of 193 nm) is used as an example.

Reticle stage RST is disposed below illumination system IOP in FIG. 1. On reticle stage RST, reticle R having a pattern surface (a lower surface in FIG. 1) on which a circuit pattern and the like are formed is mounted. Reticle R is fixed on reticle stage RST by, for example, vacuum adsorption.

Reticle stage RST is finely drivable within a horizontal plane (the XY plane) and also drivable in a predetermined stroke range in a scanning direction (the Y-axis direction that is a lateral direction on the page surface of FIG. 1), with a reticle stage drive system 11 (not shown in FIG. 1, see FIG. 8) including, for example, a linear motor or a planar motor or the like. Positional information within the XY plane (including rotational information in the θz direction) of reticle stage RST is constantly detected at a resolution of, for example, around 0.25 nm with a reticle laser interferometer (hereinafter, referred to as "reticle interferometer") 14 via a movable mirror 12 (or a reflection surface formed at the end surface of reticle stage RST). Measurement information of reticle interferometer 14 is supplied to a main controller 20 (not shown in FIG. 1, see FIG. 8). Incidentally, in the present embodiment, instead of the reticle interferometer described above, an encoder may be used to detect the position of reticle stage RST within the XY plane.

Projection unit PU is disposed below reticle stage RST in FIG. 1. Projection unit PU includes a lens barrel 45 and projection optical system PL held within lens barrel 45. As projection optical system PL, for example, a dioptric system composed of a plurality of optical elements (lens elements) arrayed along optical axis AXp parallel to the Z-axis direction is used. Projection optical system PL is, for example, both-side telecentric, and has a predetermined projection magnification (such as ¼ times, ⅕ times or ⅛ times).

Therefore, when illumination area TAR on reticle R is illuminated with illumination light IL from illumination system IOP, illumination light IL, which has passed though reticle R whose pattern surface is placed substantially coincident with a first plane (an object plane) of projection optical system PL, forms a reduced image of a circuit pattern (a reduced image of part of the circuit pattern) of reticle R within illumination area IAR, onto an area (hereinafter, also referred to as an exposure area) IA, conjugate with illumination area IAR described above, on wafer W whose surface is coated with resist (sensitive agent) and which is placed on a second plane (an image plane) side. Then, by driving in synchronization of reticle stage RST and wafer stage WST, reticle R is moved in a scanning direction (the Y-axis direction) relative to illumination area IAR (illumination light IL) and also wafer W is moved in the scanning direction (the Y-axis direction) relative to exposure area IA (illumination light IL), and thereby scanning exposure of one shot area (a divided area) on wafer W is performed and the pattern of reticle R is transferred onto the shot area. That is, in the present embodiment, a pattern of reticle R is generated on wafer W by illumination system IOP and projection optical system PL, and the pattern is formed on wafer W by exposure of a sensitive layer (a resist layer) on wafer W with illumination light IL.

Wafer stage WST is, as shown in FIG. 1, equipped with a stage main body 52 and a wafer table WTB mounted on stage main body 52. Wafer stage WST is driven in predetermined strokes in the X-axis direction and the Y-axis direction on a stage base 22 and is also finely driven in the Z-axis direction, the θx direction, the θy direction and the θz direction, with a stage drive system 24 that includes, for example, a linear motor or a planar motor or the like.

Wafer W is fixed on wafer table WTB by, for example, vacuum adsorption via wafer holder WH (not shown in FIG. 1, see FIG. 2) serving as a substrate holding section.

Figure 2:
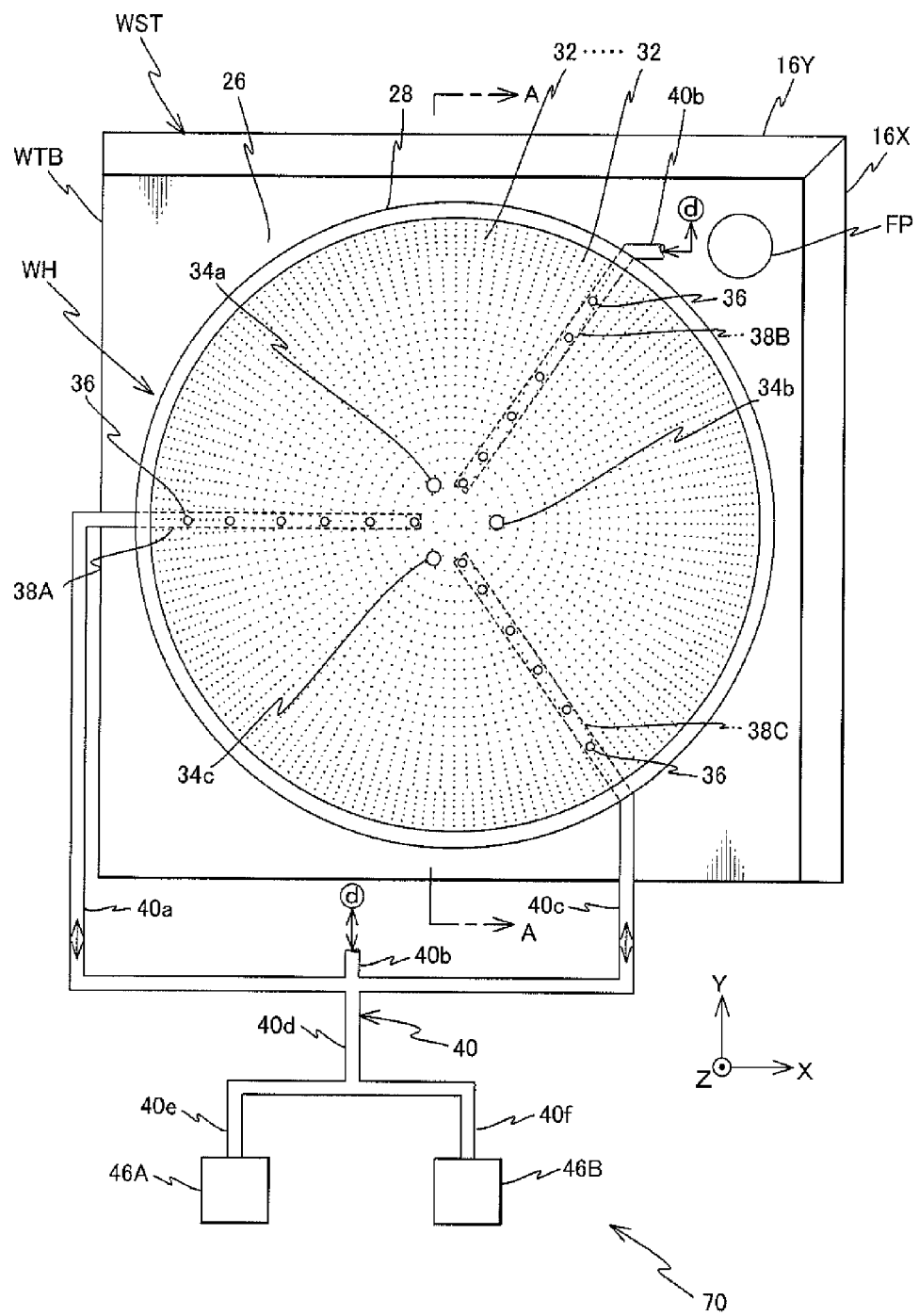
FIG. 2 is a plan view showing a wafer stage in FIG. 1.
Figure 3:
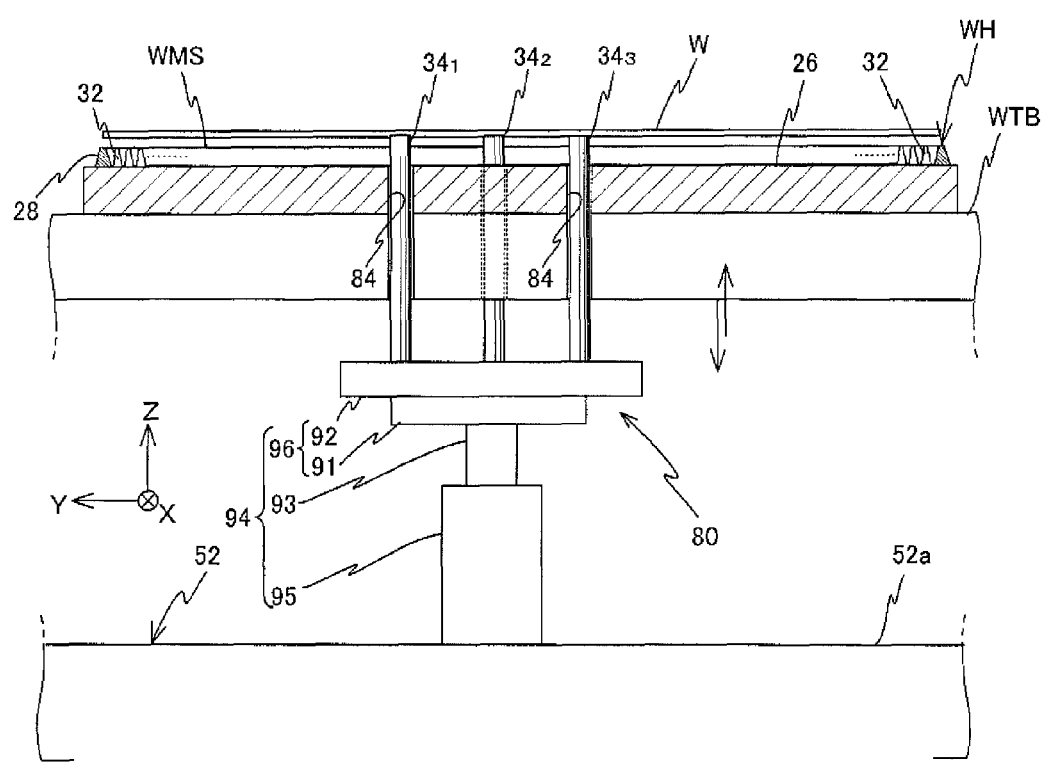
FIG. 3 is a view showing a partially sectioned configuration of the wafer stage, with partial omission.

FIG. 2 shows a plan view of wafer stage WST without wafer W, together with an air supply/exhaust mechanism of wafer holder WH. And, FIG. 3 shows a simplified section view taken along the line A-A line of FIG. 2 with partial omission, together with the wafer.

As shown in FIG. 2, wafer holder NH having substantially the same size as wafer W is fixed on the upper surface of wafer stage WST, i.e., in the center of the upper surface of wafer table WTB.

Wafer holder WH is, as shown in the plan view of FIG. 2, equipped with: a base section 26; a plurality of projecting pin sections 32 that are provided at a predetermined distance in an area of a predetermined size in the center portion, except for an annular area with a predetermined width in the vicinity of the outer periphery of the upper surface (the surface on the front side on the page surface of FIG. 2) of base section 26; an annular projecting section (hereinafter, referred to as a "rim section") 28 that is provided in the vicinity of the outer periphery edge in a state of surrounding the area in which the plurality of pin sections 32 are disposed; and the like.

Wafer holder WH is made of a material with a low thermal expansion coefficient, e.g., ceramics or the like, and the surface of the material such as ceramics having a discoidal shape as a whole is etched, and thereby base section 26 having a circular plate shape structuring the bottom surface portion, and rim section 28 and the plurality of pin sections 32 provided protruding on the upper surface of base section 26 are integrally formed. The outer diameter of rim section 28 is set slightly smaller than the outer diameter of wafer W, e.g., is set to around 1 to 2 mm smaller, and the upper surface of rim section 28 is processed to be horizontal and flat so that a gap is not generated between the upper surface and the rear surface of wafer W when wafer W is placed on the upper surface.

As shown in FIG. 3, pin sections 32 each have a projection shape so that the tip portion of each pin section is positioned substantially coplanar with rim section 28. These pin sections 32 are disposed along multiple concentric circles with a reference point on base section 26, which is the center point in this case, serving as the center.

With respect to wafer holder WH configured as described above, in the manufacturing phase, after base section 26, pin sections 32 and rim section 28 are integrally formed as is described previously, polishing processing is applied to the upper end surface of the plurality of pin sections 32 and the upper surface of rim section 28 that ultimately serve as the contacting surface with wafer W, using a polisher, abrasive grains or the like. As a result, the upper end surfaces of the plurality of pin sections 32 and the upper surface of rim section 28 are positioned substantially coplanar. In the present embodiment, a plane connecting the upper end surfaces of the plurality of pin sections 32 (which coincide with the upper surface of rim section 28) forms a wafer mounting plane WMS of wafer holder WH. In this case, a section in which pin sections 32 do not exist, of an inside area of rim section 28, is a space and there is no surface in fact. Consequently, hereinafter, of wafer mounting plane WMS, the upper surface of rim section 28 and the inside area of rim section 28 are referred to as a wafer holding area, and denoted as wafer holding area WMS using the same reference sign as the wafer mounting plane.

Referring back to FIG. 2, in the vicinity of the center portion of base section 26, three through holes 84 (not shown in FIG. 2, see FIG. 3) in a vertical direction (a direction orthogonal to the page surface) are formed at positions of the respective vertices of a substantially equilateral triangle, in a state of not mechanically interfering with pin sections 32. These three through-hoes 84 are, as shown in FIG. 3, formed penetrating base section 26 of wafer holder WH and wafer table WTB in the Z-axis direction (the vertical direction). In the three through holes 84, vertical movement pin units $34_1$, $34_2$ and $34_3$ (also referred to as "movable member", as needed) having a roughly columnar shape are inserted, respectively. The three (three units of) vertical movement pin units $34_1$, $34_2$ and $34_3$ can each be vertically moved between a first position (an upper limit movement position) in which their upper ends (also referred to as one ends) protrude above wafer holding area WMS, and a second position (a lower limit movement position) in which the upper ends do not protrude above wafer holding area WMS, via through hole 84, by being driven by a drive device 94 (to be described later). In the present embodiment, the respective lower limit movement positions of the three vertical movement pin units $34_1$, $34_2$ and $34_3$ are set at the same position as the upper surface of base section 26 or at a position below the upper surface. As shown in FIG. 3, the three vertical movement pin units $34_1$, $34_2$ and $34_3$ are each fixed to the upper surface of a main body unit 96 (a main body section 92) that configures part of drive device 94 (to be described later). In the present embodiment, the respective upper end surfaces of the three vertical movement pin units $34_1$, $34_2$ and $34_3$ are positioned on a plane having the same height.

The three vertical movement pin units $34_1$, $34_2$ and $34_3$ are driven by drive device 94, thereby to be freely lifted/lowered simultaneously by the same amount in the vertical direction (the Z-axis direction). In the present embodiment, the three vertical movement pin units $34_1$, $34_2$ and $34_3$ and drive device 94 configure a center-up unit 80. The configuration of center-up unit 80 will be described in more detail later. Incidentally, the three vertical movement pin units $34_1$, $34_2$ and $34_3$ need not necessarily be lifted/lowered simultaneously by the same amount, and for example, such a configuration may be employed that these vertical movement pin units are lifted/lowered independently from each other by drive device 94.

At the time of wafer loading and wafer unloading which will be described later, by being driven by drive device 94, the three vertical movement pin units $34_1$, $34_2$ and $34_3$ can support wafer W from below or can be vertically moved in a state of supporting wafer W.

Referring back to FIG. 2, on the upper surface of base section 26, a plurality of air supply/exhaust openings 36 are formed at a predetermined distance along radiation directions (three radial directions at intervals of the central angle of about 120 degrees) from the vicinity of the center portion of the upper surface of base section 26. These air supply/exhaust openings 36 are also formed at positions that do not mechanically interfere with pin sections 32. Air supply/exhaust openings 36 are in a state of communicating with air supply/exhaust branch pipes 40a, 40b and 40c that are coupled to the outer peripheral surface of base section 26, via air supply/exhaust passages 38A, 38B and 38C, respectively, that are formed inside base section 26. Air supply/exhaust branch pipes 40a, 40b and 40c configure part of an air supply/exhaust mechanism 70 which will be described later.

Each of air supply/exhaust passages 38A, 38B and 38C is made up of: an arterial passage that is formed along a radial direction from the outer peripheral surface of base section 26 toward the vicinity of the center portion of base section 26; and a plurality of branch passages that are each branched in the +Z direction from the arterial passage, at a predetermined distance along the radial direction. In this case, the respective opened ends of the upper ends of the plurality of branch passages serve as air supply/exhaust openings 36 described previously.

To wafer holder WH, coupled is air supply/exhaust mechanism 70 including a vacuum adsorption mechanism that adsorbs and holds wafer W, mounted on wafer holder WH and supported from below by the plurality of pin sections 32 and rim section 28, against the respective upper end surfaces (also referred to as the upper end portions or one end portions) of the plurality of pin sections 32 and rim section 28.

Air supply/exhaust mechanism 70 is, as shown in FIG. 2, equipped with a vacuum pump 46A and an air supply device 46B, and an air supply/exhaust pipes 40 that couples vacuum pump 46A and air supply device 46B to each of air supply/exhaust passage 38A to 38C.

Air supply/exhaust pipe 40 is configured of an air supply/exhaust main pipe 40d, air supply/exhaust branch pipes 40a, 40b and 40c described previously that are branched into three from one end of air supply/exhaust main pipe 40d, and an air exhaust branch pipe 40e and an air supply branch pipe 40f that are branched into two from the other end of air supply/exhaust main pipe 40d.

To the end portion of air exhaust branch pipe 40e on the side opposite to air supply/exhaust main pipe 40d, vacuum pump 46A is coupled. And, to the end portion of air supply branch pipe 40f on the side opposite to air supply/exhaust main pipe 40d, air supply device 46B is coupled.

Further, to part of air supply/exhaust main pipe 40d, a pressure sensor 98 (not shown in FIG. 2, see FIG. 8) for measuring the pressure inside air supply/exhaust pipe 40 is coupled. The measurement values of pressure sensor 98 are supplied to a main controller 20, and main controller 20 controls ON/OFF (operation/non-operation) of vacuum pump 46A and air supply device 46B, based on the measurement values of pressure sensor 98 and control information of loading/unloading of a wafer. Incidentally, instead of controlling the ON/OFF of vacuum pump 46A and air supply device 46B, vacuum pump 46A and air supply device 46B may be coupled to air exhaust branch pipe 40e and air supply branch pipe 40f, respectively, via valves (not shown) such as electromagnetic valves, and the opening/closing control of these valves may be performed. Further, instead of air supply/exhaust mechanism 70 of the present embodiment, an air supply/exhaust mechanism may be used that are equipped with: a first vacuum pump for vacuum exhaustion at the normal time; a vacuum chamber and a second vacuum pump for high-speed exhaustion used during the wafer loading; and an air supply device, as disclosed in, for example, U.S. Pat. No. 6,710,857.

a first vacuum pump for vacuum exhaustion at the normal time; a vacuum chamber and a second vacuum pump for high-speed exhaustion used during the wafer loading; and an air supply device, as disclosed in, for example, U.S. Pat. No. 6,710,857.

The configuration and the like of center-up unit 80 will be described now. Center-up unit 80 is, as shown in FIG. 3, equipped with the three vertical movement pin units $34_1$ to $34_3$ and drive device 94 that drives the three vertical movement pin units $34_1$ to $34_3$ in the vertical direction.

Drive device 94 has: main body unit 96 to the upper surface of which the three vertical movement pin units $34_1$ to $34_3$ are attached; a drive axis 93 to the upper end surface of which main body unit 96 is fixed; and a drive mechanism 95 that drives drive axis 93 in the vertical direction, integrally with main body unit 96 and the three vertical movement pin units $34_1$ to $34_3$. Incidentally, of the three vertical movement pin units $34_1$ to $34_3$, portions attached to main body unit 96 are also referred to as "lower ends" or "the other ends" as needed. That is, the lower ends of the three vertical movement pin units $34_1$ to $34_3$ are the end portions on the opposite side to the upper ends of the three vertical movement pin units $34_1$ to $34_3$, and include regions attached to main body unit 96.

Main body unit 96 is disposed parallel to the XY plane, and includes a plate-shaped pedestal member 91 whose lower surface is fixed to the upper end surface of drive axis 93, and main body section 92 fixed to the upper surface of pedestal member 91. The axis center position of drive axis 93 substantially coincides with the center of gravity of main body unit 96. Accordingly, the axis center position of drive axis 93 does not necessarily coincide with the center of gravity of the triangle (the equilateral triangle in the present embodiment) connecting the installed points of the three vertical movement pin units $34_1$ to $34_3$ that coincides with the center of wafer holder WH (wafer holding area WMS).

Drive mechanism 95 includes, for example, a motor (e.g., a voice coil motor or a linear motor) as a drive source, and drives drive axis 93 in the vertical direction with the drive force of the motor. Drive mechanism 95 is fixed on a bottom wall 52a of stage main body 52. Based on control signals from main controller 20, drive mechanism 95 vertically moves main body unit 96 and the three vertical movement pin units $34_1$ to $34_3$ via drive axis 93, in a predetermined range, i.e., between the lower limit movement position and the upper limit movement position described previously. Incidentally, in the case when the axis center of drive axis 93 does not coincide with the center of gravity of the equilateral triangle connecting the installed points of the three vertical movement pin units $34_1$ to $34_3$, it is desirable to provide a guide member that accurately guides main body unit 96 and the three vertical movement pin units $34_1$ to $34_3$ into the Z-axis direction.

Figure 4:
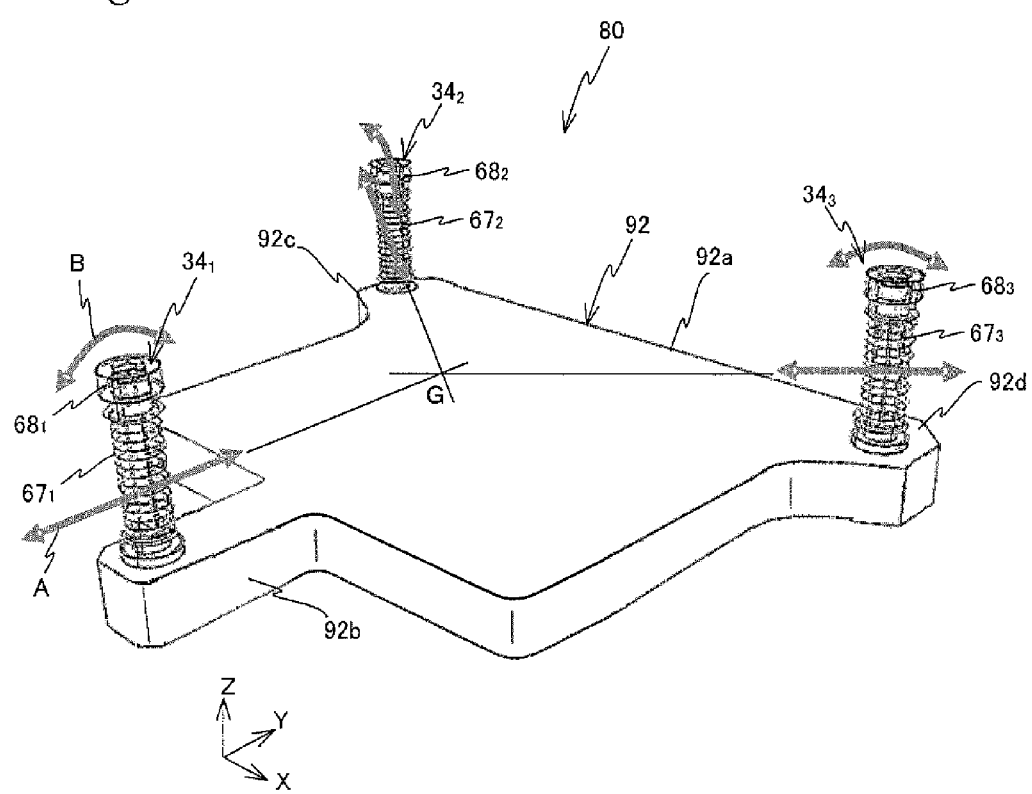
FIG. 4 is a perspective view showing three vertical movement pin units, together with part (a main body section) of a main body unit that configures part of a center-up unit in FIG. 3.

Main body section 92 that configures part of main body unit 96 is, as shown in FIG. 4, a member that has: a plate-shaped section 92a having a roughly rectangular shape in a planar view (viewed from above (the +Z direction)); a protruding section 92b that protrudes to the −Y side from the center portion in the X-axis direction of the −Y side surface of plate-shaped section 92a; and protruding sections 92c and 92d that outwardly protrude in the X-axis direction, respectively, from both end portions in the X-axis direction of the side end portion of plate-shaped section 92a. To the respective upper surfaces of protruding sections 92b, 92c and 92d, vertical movement pin units $34_1$, $34_2$ and $34_3$ are individually attached. Vertical movement pin units $34_1$ to $34_3$ are disposed at positions on main body section 92 that are substantially the respective vertices of an equilateral triangle in a planar view, as an example.

Vertical movement pin units $34_1$, $34_2$ and $34_3$ are attached in a similar manner except for the attached positions, and are also configured in a similar manner. Vertical movement pin unit $34_1$ is representatively taken up herein, and its configuration and the structure of the attachment sections are explained.

Figure 5:
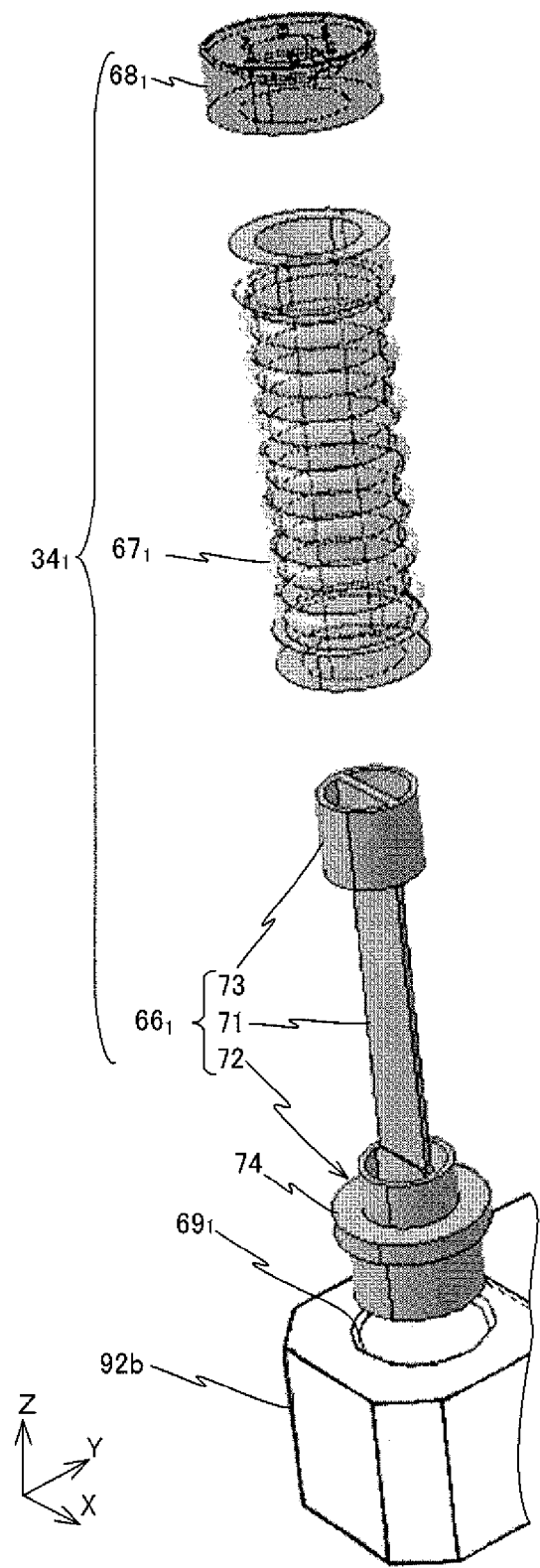
FIG. 5 is a disassembled perspective view showing the vertical movement pin unit in FIG. 4.
Figure 6:
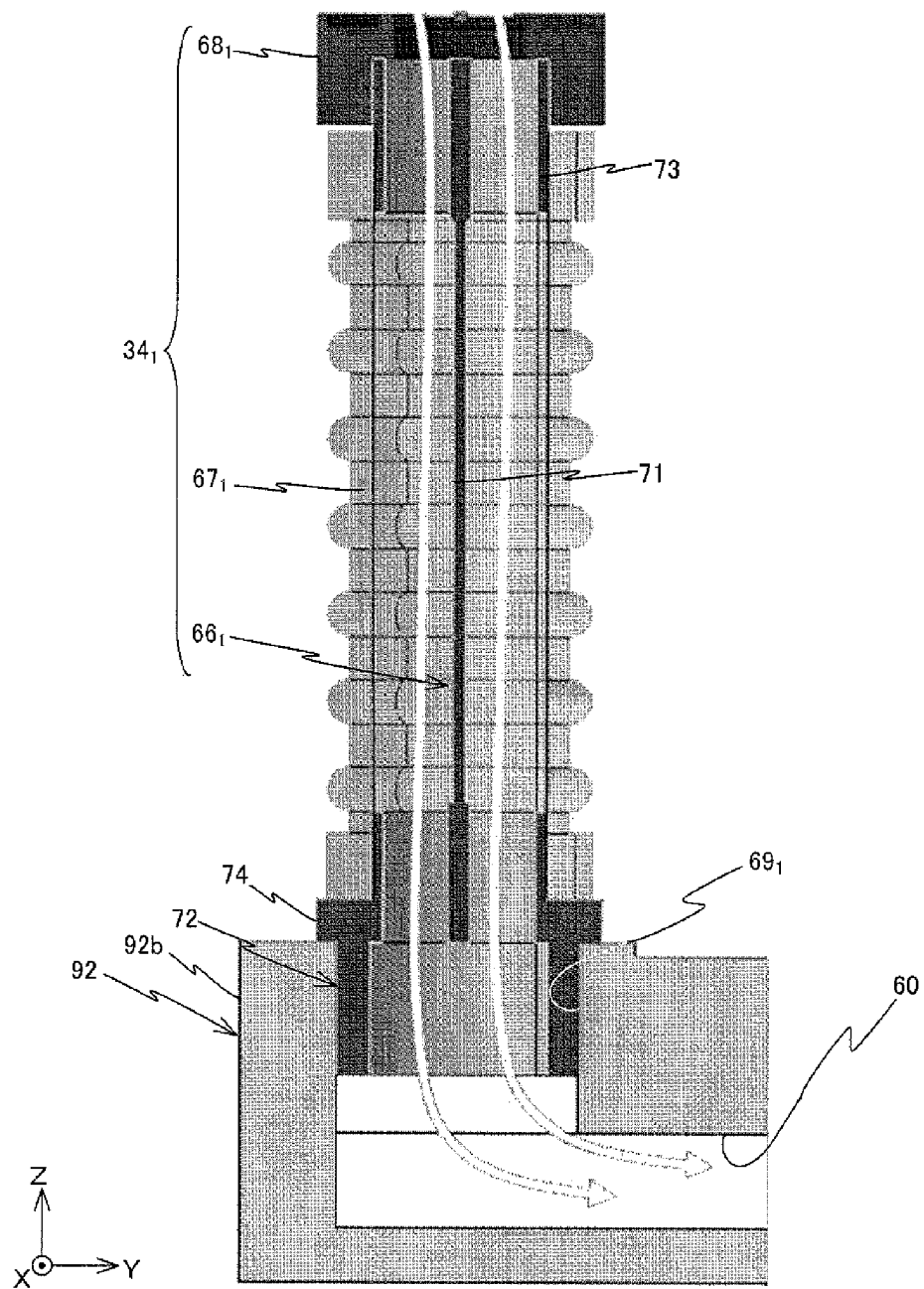
FIG. 6 is a view showing an internal configuration of the vertical movement pin unit.

On the upper surface of protruding section 92b, as shown in FIG. 6 (and FIG. 5), a circular opening $69_1$ having a predetermined depth is formed. Inside opening $69_1$, as shown in FIG. 6, the lower end of vertical movement pin unit $34_1$ is inserted with almost no gap, and by this insertion, vertical movement pin unit $34_1$ is fixed to main body section 92.

Vertical movement pin unit $34_1$ is, as shown in FIG. 5, configured of a combination of a plate spring unit $66_1$, a flexible tube $67_1$ and a pin head $68_1$.

Figure 7A:
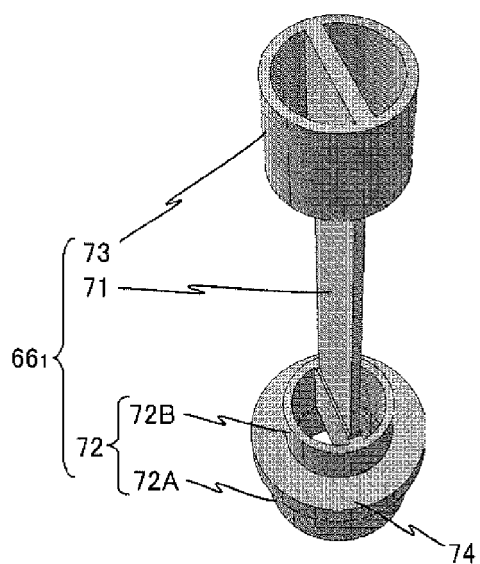
FIGS. 7A and 7B are perspective views of a plate spring unit that configures part of the vertical pin unit, when viewed from an obliquely upward direction and an obliquely downward direction, respectively.
Figure 7B:
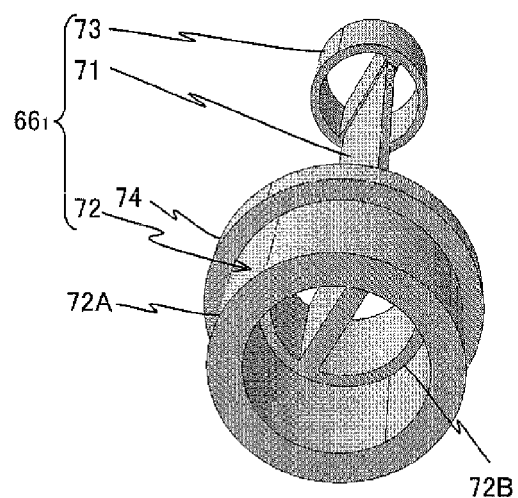

Plate spring unit $66_1$ includes, as shown in FIG. 5 and FIGS. 7A and 7B, a plate spring 71 (also referred to as "displacement section" as needed) that extends a predetermined length in the Z-axis direction, a base connector 72 connected to the lower end portion (also referred to as "the other end portion" as needed) of plate spring 71, and a head connector 73 connected to the upper end portion of plate spring 71.

Plate spring 71 is a plane plate spring made up of a thin metal plate (a thin-wall plate-shaped member) such as a spring steel, and has a predetermined length in the height direction (the Z-axis direction). Plate spring 71 has, as shown in FIG. 6, the upper end portion and the lower end portion that are thick-wall portions thicker than the rest. Plate spring 71 has the rigidity in the thin-wall direction (the Y-axis direction in FIGS. 5 and 6) much lower than that in the thick-wall direction (the Z-axis direction and the X-axis direction in FIG. 5). Therefore, plate spring 71 is freely deformed (bending deformation, flexural deformation) in the YZ plane. As shown in FIG. 6, in the present embodiment, plate spring 71 as the displacement section, is disposed between the upper end (e.g. pin head $68_1$) and the lower end (e.g., base connector 72) of vertical movement pin unit $34_1$.

Base connector 72 is, for example, as shown in FIG. 5, made up of a stepped member having a cylindrical shape with a flange section 74 provided in the center portion in the height direction. Base connector 72 is, as shown in FIGS. 7A and 7B, formed by integrating a first cylindrical member 72A provided with flange section 74 at the upper end portion and a second cylindrical member 72B having the lower end portion whose part is inserted inside cylindrical member 72A from above without any gap. Second cylindrical member 72B has a wall thickness that is thinner compared with first cylindrical member 72A. Inside second cylindrical member 72B, the thick-wall portion on the lower end side of plate spring 71 is inserted in a state of bisecting the internal space of second cylindrical member 72B, and both members are integrally connected to each other.

Plate spring unit $66_1$ is supported from below by protruding section 92b via flange section 74, by second cylindrical member 72B being inserted inside opening $69_1$. That is, flange section 74 functions as a fall-prevention member for plate spring unit $66_1$.

Head connector 73 is made up of a cylindrical member similar to second cylindrical member 72B, and inside head connector 73, the thick-wall portion on the upper end side of plate spring 71 is inserted in a state of bisecting the internal space of head connector 73, and both members are integrally connected to each other.

Flexible tube $67_1$ is made up of a bellows member (a bellows) having a cylindrical shape, and the lower end surface of flexible tube $67_1$ is connected to the upper surface of flange section 74 of base connector 72 in a state in which plate spring unit $66_1$ is inserted inside flexible tube $67_1$. Further, since flexible tube $67_1$ is made up of a bellows member, it slightly elongates and contracts in the Z-axis direction, and is freely bendable. However, in the X-axis direction in which the rigidity of plate spring 71 is high, the deformation of flexible tube $67_1$ is hindered by plate spring 71.

Pin head $68_1$ is, as shown in FIGS. 5 and 6, made up of a thick-wall member having a cylindrical shape with a low height, in the center par of which a stepped opening having a circular shape is formed. The stepped opening formed in pin head $68_1$ has an inner diameter (a diameter) on the lower side that is larger than an inner diameter (a diameter) on the upper side, and the inner diameter on the lower side is substantially the same as an outer diameter of head connector 73. Head connector 73 and pin head $68_1$ are integrated, in a state in which head connector 73 of plate spring unit $66_1$ abuts against a step section of the stepped opening of pin head $68_1$, and thereby plate spring unit $66_1$, pin head $68_1$ and flexible tube $67_1$ are assembled. In this assembled state, the upper end surface of flexible tube $67_1$ faces the lower surface of pin head $68_1$ via a small gap. Incidentally, the shape of pin head $68_1$ is not limited to the above-described one, and for example, an opening may be rectangular or the outer shape may be a prismatic shape.

The other vertical movement pin units $34_2$ and $34_3$ are configured similarly to vertical movement pin unit $34_1$ described above, and are attached to the upper surfaces of protruding sections 92c and 92d, respectively. However, vertical movement pin unit $34_2$ is attached to protruding section 92c in a state in which the normal direction (the thin-wall direction) of the surface of plate spring 71 that configures part of vertical movement pin unit $34_2$ coincides with a direction at an angle of +60 degrees with respect to the Y-axis within the XY plane. Further, vertical movement pin unit $34_3$ is attached to protruding section 92d in a state in which the normal direction (the thin-wall direction) of the surface of plate spring 71 that configures part of vertical movement pin unit $34_3$ coincides with a direction at an angle of −60 degrees with respect to the Y-axis within the XY plane.

That is, in the present embodiment, the orientations of the surfaces of the three spring plates 71 are set so that the normal lines of the surfaces of the three spring plates 71 that are individually equipped in vertical movement pin units $34_1$, $34_2$ and $34_3$ intersect, within the XY plane, at a center of gravity G (which coincides with the circumcenter and the incenter) of the equilateral triangle that connects the installed points (three points on the XY plane) of vertical movement pin units $34_1$ to $34_3$ (see FIG. 4). Therefore, vertical movement pin units $34_1$ to $34_3$ are configured so that pins heads $68_1$, $68_2$ and $68_3$ positioned at the upper ends are moved, by the action of external forces, in a radial direction of a circumcircle with the center of gravity G described above (which substantially coincides with the center of wafer holding area WMS of wafer holder WH) serving as the center, i.e., in a direction for moving away from the center of wafer holding area WMS of wafer holder WH described previously or in a direction for moving closer to the center. Further, vertical movement pin units $34_1$ to $34_3$ are configured so that the sections upper than base connectors 72 of their respective lower ends swing (turn) around an axis orthogonal to the radial direction described above and to a vertical axis (Z-axis) direction.

Inside main body section 92, as shown in FIG. 6 in which the vicinity of protruding section 92*b* is representatively taken up, a flow passage (space) 60 that communicates with the internal space of each of protruding sections 92*b*, 92*c* and 92*d* is formed, and flow passage 60 communicates with the inside of first cylindrical member 72A of base connector 72 attached to each protruding section.

As can be seen from the foregoing description, the three vertical movement pin units $34_1$ to $34_3$ are coupled to main body section 92, and thereby a flow passage that communicates from flow passage 60 in main body section 92 to the stepped openings of pin heads $68_1$ to $68_3$ is formed. A vacuum pump 46C (see FIG. 8) is coupled to flow passage 60 via a piping system (now shown). By main controller 20 setting the inside of flow passage 60 into negative pressure using vacuum pump 46C, in a state in which wafer W is supported from below by the three vertical movement pin units $34_1$ to $34_3$, wafer W is adsorbed and held, from its rear surface (lower surface) side, on the upper ends (pin heads $68_1$ to $68_3$) of the three vertical movement pin units $34_1$ to $34_3$.

Referring back to FIG. 1, positional information of wafer stage WST within the XY plane (which includes rotational information (a yawing amount (a rotation amount θz in the θz direction), a pitching amount (a rotation amount θx in the θx direction), and a rolling amount (a rotation amount θy in the θy direction))) is constantly detected at a resolution of, for example, around 0.25 nm with a laser interferometer system (hereinafter, shortly referred to as an "interferometer system") 18 via a movable mirror 16. Herein, practically, a Y movable mirror 16Y having a reflection surface orthogonal to the Y-axis and an X movable mirror 16X having a reflection surface orthogonal to the X-axis are fixed to wafer stage WST, as shown in FIG. 2. Further, interferometer system 18 is configured including a Y interferometer and an X interferometer, corresponding to the movable mirrors, that irradiate Y movable mirror 16Y and Y movable mirror 16X, respectively, with measurement beams, but these movable mirrors and interferometers are representatively shown by movable mirror 16 and interferometer system 18 in FIG. 1.

Figure 8:
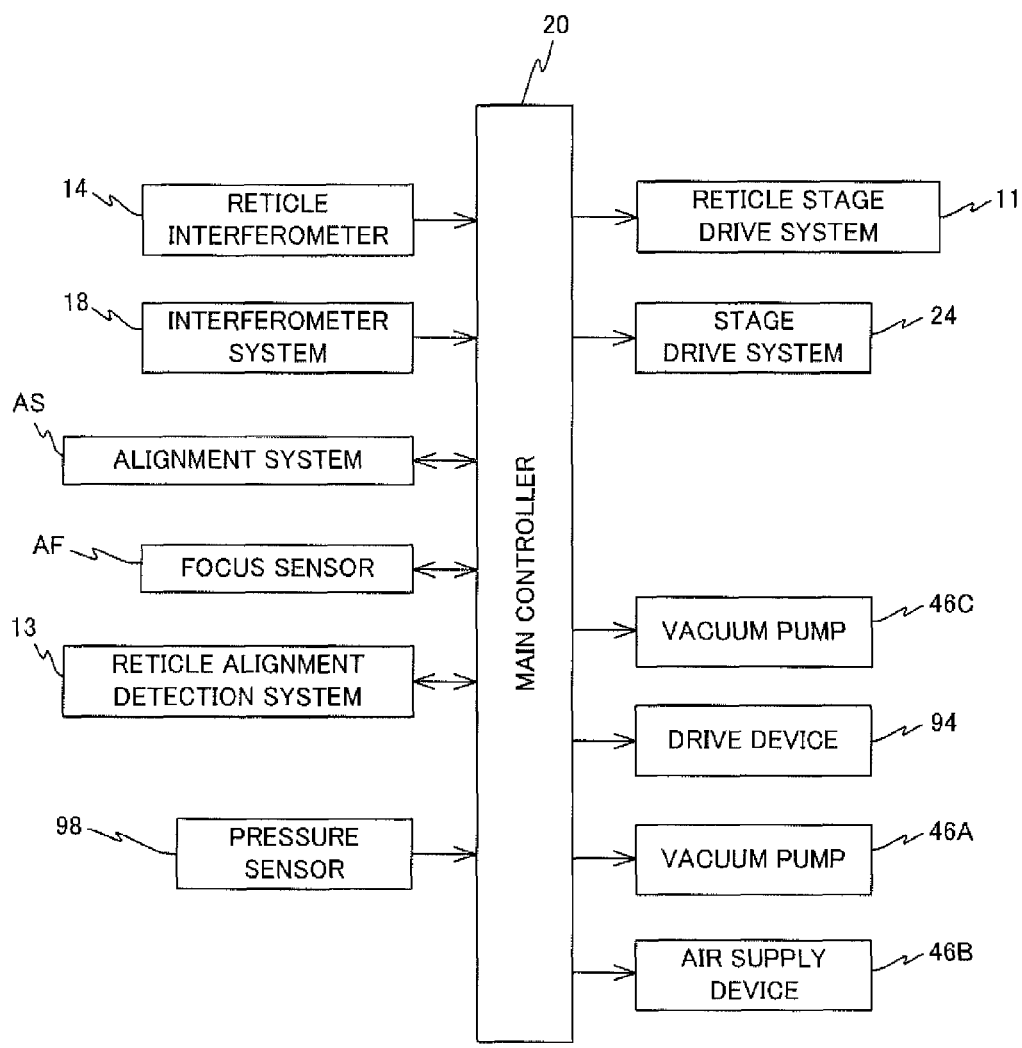
FIG. 8 is a block diagram showing input/output relationships of a main controller that is mainly configured of a control system of the exposure apparatus related to the embodiment.

Measurement information of interferometer system 18 is supplied to main controller 20 (see FIG. 8). Main controller 20 controls the position of wafer stage WST within the XY plane (including the rotation in the θZ direction) via stage drive system 24, based on measurement information of interferometer system 18. Incidentally, the position of wafer stage WST within the XY plane may be detected using, for example, an encoder system in which scales (diffraction gratings) or heads are mounted on a wafer stage, instead of interferometer system 18.

Further, although omitted in FIG. 1, the position and an inclination amount in the Z-axis direction of the surface of wafer W held by wafer holder WH are measured by a focus sensor AF (see FIG. 8) made up of a multipoint focal position detection system of an oblique incident method that is disclosed in, for example, U.S. Pat. No. 5,448,332 and the like. Measurement information of such focus sensor AF is also supplied to main controller 20 (see FIG. 8).

Further, on wafer stage WST, a fiducial plate FP (see FIGS. 1 and 2) whose surface is at the same height as the surface of wafer W. On the surface of fiducial plate FP, a plurality of fiducial marks are formed that include a pair of first marks that are detected with a reticle alignment detection system to be described later and second marks used in baseline measurement of an alignment detection system AS to be described later and the like.

Further, on the side surface of lens barrel 45 of projection unit PU, alignment detection system AS that detects alignment marks and reference marks formed on wafer W is provided. As alignment detection system AS, an FIA (Field Image Alignment) system is used, as an example, which is a type of an image-forming alignment sensor of an image processing method that irradiates a mark with broadband (wideband) light such as halogen lamp and measures the mark position by performing image processing of the mark image.

In exposure apparatus 100, a pair of reticle alignment detection systems 13 (not shown in FIG. 1, see FIG. 8) composed of TTR (Through The Reticle) alignment systems using light with an exposure wavelength are further provided above reticle stage RST, which is disclosed in, for example, U.S. Pat. No. 5,646,413 and the like. Detection signals of reticle alignment detection systems 13 are supplied to main controller 20 (see FIG. 8).

FIG. 8 shows a block diagram showing input/output relationships of main controller 20 that is mainly configured of a control system of exposure apparatus 100 and performs overall control of the respective components. Main controller 20 includes a workstation (or a microcomputer), and performs the overall control of the respective components of exposure apparatus 100.

Next, a series of operations performed in exposure apparatus 100 configured as described above will be described, focusing on a wafer exchange operation (loading and unloading operations of wafers).

For example, in processing of a first wafer in a lot, first of all, reticle R is loaded on reticle stage RST, and main controller 20 performs reticle alignment and baseline measurement of alignment detection system AS according to the procedures disclosed in, for example, U.S. Pat. No. 5,646,413 and the like, using the pair of reticle alignment detection systems 13, the pair of first marks and second marks on fiducial plate FP, and alignment detection system AS.

Subsequently, at a wafer exchange position (not shown), wafer W that has been coated with sensitive agent (resist) by a coater/developer (not shown) that is, for example, inline-coupled to exposure apparatus 100 is loaded on wafer holder WH of wafer stage WST. This loading of wafer W is performed in the procedures described below. Incidentally, the explanation of adsorption of wafers and releasing of the adsorption by a loading arm, an unloading arm and the like will be omitted in the following description.

Figure 9A:
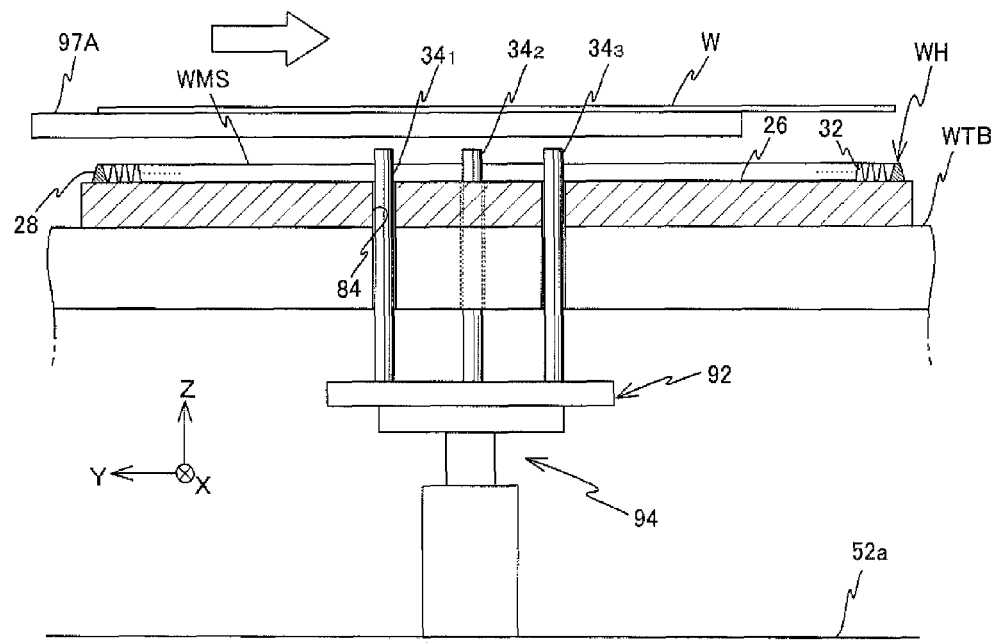
FIGS. 9A and 9B are views (No. 1 and No. 2) used to explain loading of a wafer on a wafer stage (a wafer holder).

First of all, as shown by an outlined arrow in FIG. 9A, wafer W is carried to above wafer holder WH by a loading arm 97A that configures part of a wafer carrier system. Next, as shown by a black arrow in FIG. 9B, main controller 20 drives vertical movement pin units $34_1$, $34_2$ and $34_3$ in the +Z direction toward the upper limit movement position described previously via drive device 94. In the midst of this movement, wafer W supported by loading arm 97A is supported from below by vertical movement pin units $34_1$, $34_2$ and $34_3$, and vertical movement pin units $34_1$, $34_2$ and $34_3$ are further driven upward, and thereby wafer W is supported from below by vertical movement pin units $34_1$, $34_2$ and $34_3$ and is delivered from loading arm 97A to vertical movement pin units $34_1$, $34_2$ and $34_3$. Prior to this delivery, vacuum pump 46C is operated by main controller 20, and the rear surface of wafer W is adsorbed and held by the three vertical movement pin units $34_1$, $34_2$ and $34_3$ (pin heads $68_1$, $68_2$ and $68_3$). At this point in time, when deformation of wafer W such as upper convex warpage or lower convex warpage occurs, wafer W is adsorbed and held, being kept in a deformed state, by the three vertical movement pin units $34_1$, $34_2$ and $34_3$.

Figure 9B:
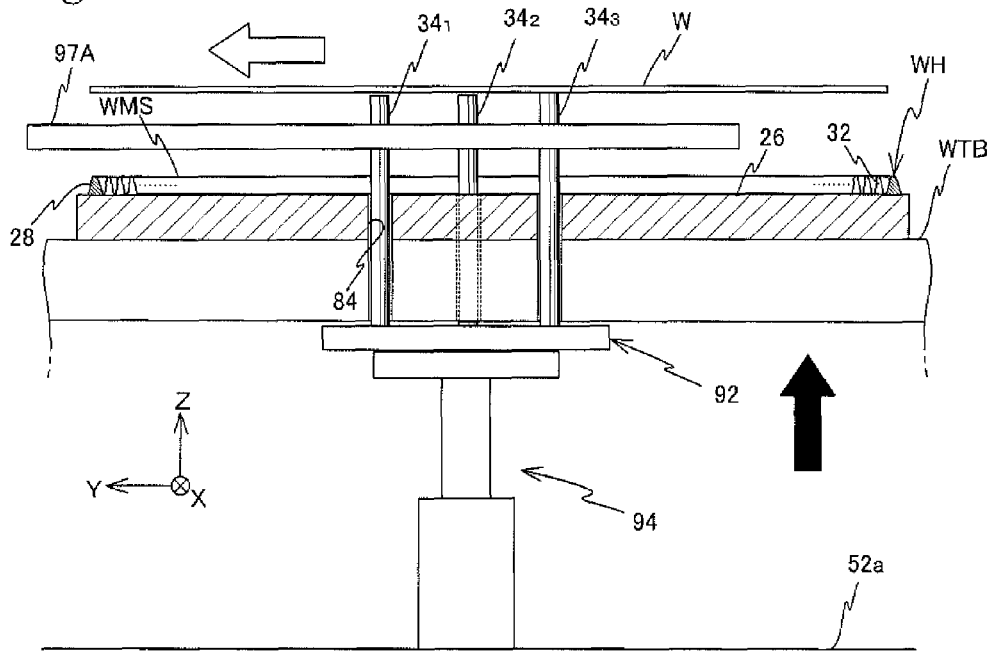
Figure 10A:
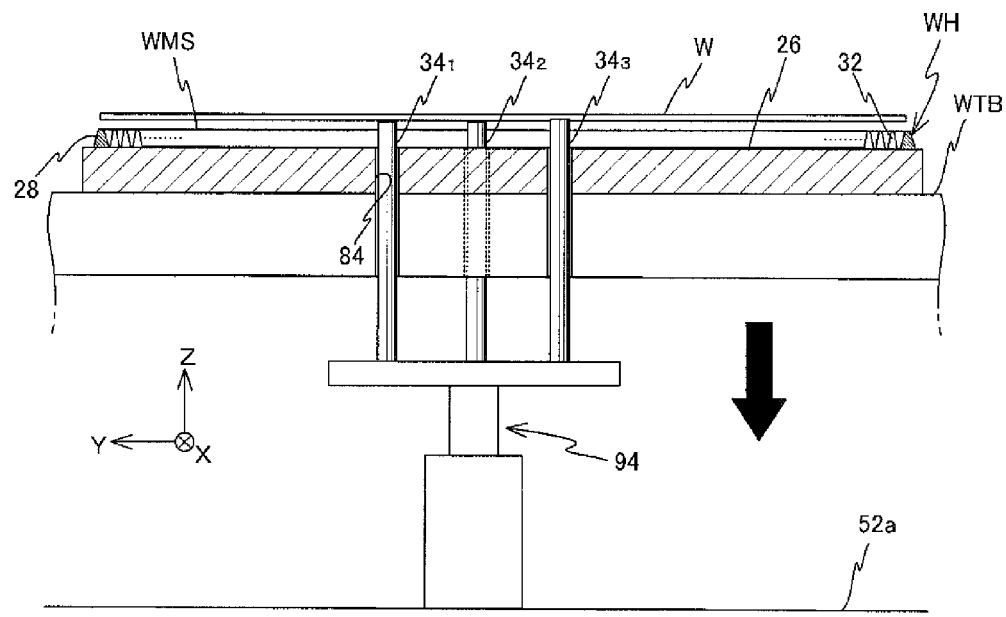
FIGS. 10A and 10B are views (No. 3 and No. 4) used to explain loading of a wafer on a wafer stage (a wafer holder).
Figure 10B:
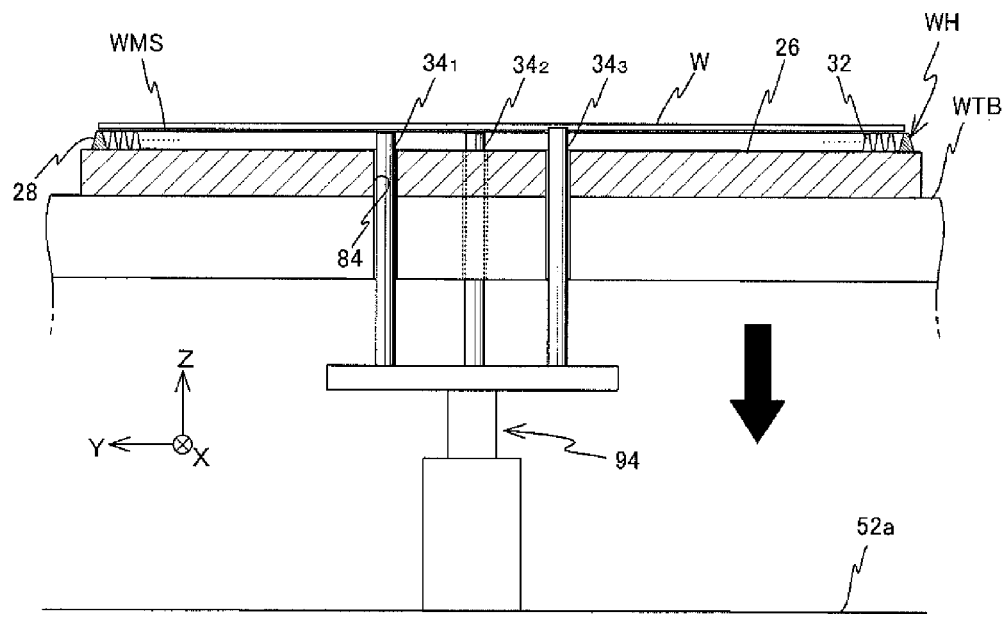

Subsequently, as shown by an outlined arrow in FIG. 9B, loading arm 97A is withdrawn from above wafer holder WH. After the withdrawal of loading arm 97A, as shown by a black arrow in FIG. 10A, main controller 20 drives vertical movement pin units $34_1$, $34_2$ and $34_3$ in the −Z direction toward the vicinity of the lower limit movement position described previously via drive device 94. Consequently, as shown in FIG. 10B, the rear surface of wafer W abuts against wafer holding area WMS of wafer holder WH, and wafer W is mounted on wafer holder WH. At this point in time, since main controller 20 operates vacuum pump 46A described previously, and wafer W is adsorbed by vacuum by wafer holder WH. In this case, when deformation of wafer W such as the upper convex warpage or lower convex warpage described previously occurs, wafer W is corrected and planarized by the suction force of wafer holder WH. With this planarized correction processing of wafer W, wafer W tries to return to a flat planar shape without warpage. At this point in time, mainly the force in a radial direction with the center of wafer W servings as the center is applied from wafer W to pin heads $68_1$ to $68_3$ of the three vertical movement pin units $34_2$ to $34_3$ that adsorb the rear surface of wafer W. For example, as shown in FIG. 4, the force in the Y-axis direction (±Y direction) (see an arrow A in FIG. 4) and/or the force in the θx direction (see an arrow B in FIG. 4) act (s) on pin head $68_1$ (a wafer adsorbing section) of vertical movement pin unit $34_1$ disposed on the −Y side, and consequently, the deformation of plate spring 71 of vertical movement pin unit $34_1$ occurs, e.g., plate spring 71 of vertical movement pin unit $34_1$ is bent (warps) with its −Z end serving as the fulcrum, or warps into, for example, an S-shape viewed from the +X direction.

According to this deformation of plate spring 71, flexible tube $67_1$ is deformed. The bending deformation referred to firstly of plate spring 71 causes pin head $68_1$ to move in the θx direction, and the S-shape flexural deformation referred to secondly of plate spring 71 causes pin head $68_1$ to move in the Y-axis direction. At this point in time, since part of flexible tube $67_1$ is in through hole 84 of wafer holder WH and wafer table WTB, the outer peripheral surface of flexible tube $67_1$ contacts with the inner wall surface of through hole 84 at times. However, such a configuration is employed that the contact between flexible tube $67_1$ and the inner wall surface of through hole 84 does not hinder the deformation of plate spring 71 because there is a predetermined gap between through hole 84 and vertical movement pin unit $34_1$ and further flexible tube $67_1$ is freely deformable.

Pin heads $68_2$ and $68_3$ of the other vertical movement pin units $34_2$ and $34_3$ moved in the radial direction or the tilt direction of wafer W (wafer holder WH) in a similar manner. Also in vertical movement pin units $34_2$ and $34_3$, such a configuration is employed that the contact between each of flexible tubes $67_2$ and $67_3$ and the inner wall surface of through hole 84 does not hinder the deformation of plate spring 71. Accordingly, in center-up unit 80, the planarized operation of wafer W is not hindered by the adsorption holding force of the three vertical movement pin units $34_1$ to $34_3$. Consequently, the distortion caused by the adsorption holding of the three vertical movement pin units $34_1$ to $34_3$ is avoided from occurring in wafer W held by wafer holder WH.

After the loading of wafer W, main controller 20 implements alignment measurement (e.g., EGA) to detect a plurality of alignment marks on wafer W, using alignment detection system AS. Consequently, arrangement coordinates of a plurality of shot areas on wafer W are obtained. Incidentally, the details of the alignment measurement (EGA) are disclosed in, for example, U.S. Pat. No. 4,780,617 and the like.

Subsequently, main controller 20 performs an exposure operation by a step-and-scan method in which a stepping operation to move wafer W to an acceleration staring position for exposure of the plurality of shot areas on wafer W based on the results of the alignment measurement, and the scanning exposure operation described previously are repeated, and a pattern of reticle R is sequentially transferred onto all the shot areas on wafer W. Incidentally, since the exposure operation by a step-and-scan method has no differences from the conventional one, the detailed description is omitted.

When the exposure is completed, wafer W that has been exposed is unloaded from wafer holder WH of wafer stage WST in the procedures as below.

Specifically, first of all, wafer stage WST is moved to a predetermined wafer exchange position, and main controller 20 stops the operation of vacuum pump 46A and also starts the operation of air supply device 46B, and the pressurized air is blown out from air supply device 46B to the rear surface side of wafer W via air supply/exhaust openings 36. Consequently, wafer W is levitated from wafer holding area WMS of wafer holder WH. Subsequently, main controller 20 drives vertical movement pin units $34_1$, $34_2$ and $34_3$ in the +Z direction toward the upper limit movement position described previously, via drive device 94. In the midst of this upward movement of vertical movement pin units $34_1$, $34_2$ and $34_3$, wafer W is supported from below by vertical movement pin units $34_1$, $34_2$ and $34_3$ and is lifted to the upper limit movement position.

Incidentally, it is also possible that each of vertical movement pin units $34_1$, $34_2$ and $34_3$ adsorbs and holds the rear surface of wafer W when vertical movement pin units $34_1$, $34_2$ and $34_3$ are moved upward.

Subsequently, an unloading arm (not shown) that configures part of the carrier system is inserted below wafer W supported by vertical movement pin units $34_1$, $34_2$ and $34_3$. Then, main controller 20 drives vertical movement pin units $34_1$, $34_2$ and $34_3$ downward (drives vertical movement pin units $34_1$, $34_2$ and $34_3$ in the −Z direction) to a predetermined stand-by position (a predetermined position between the upper limit movement position and the lower limit movement position). In the midst of this downward movement of vertical movement pin units $34_1$, $34_2$ and $34_3$, wafer W is delivered from vertical movement pin units $34_1$, $34_2$ and $34_3$ to the unloading arm. Incidentally, in the case when each of vertical movement pin units $34_1$, $34_2$ and $34_3$ adsorbs and holds the rear surface of wafer W, the adsorption is released immediately before the delivery. Then, the unloading arm holds wafer W and is withdrawn. After that, the loading operation of wafer W and the subsequent operations described above are repeatedly performed and a plurality of wafers in a lot are sequentially processed. After the processing of the lot is completed, the similar processing is repeatedly performed to wafers in a next lot.

As is described above, with wafer stage WST equipped in exposure apparatus 100 related to the present embodiment, when wafer W whose rear surface is adsorbed by pin heads $68_1$, $68_2$ and $68_3$ of the three vertical movement pin units $34_1$, $34_2$ and $34_3$ is mounted on wafer holding area WMS (the wafer mounting plane) of wafer holder WH, wafer W is adsorbed by wafer holder WH and changed in shape (planarized). On that occasion, in order to prevent the change in shape of wafer W from being hindered, upon receipt of the force (an example of the external force described in the present embodiment) from wafer W, in vertical movement pin units $34_1$, $34_2$ and $34_3$, plate springs 71 that vertical movement pin units $34_1$, $34_2$ and $34_3$ respectively have are displaced in at least one direction (the thin-wall direction), and consequently at least part including each of heads $68_1$, $68_2$ and $68_3$ is displaced in at least one direction of the respective two directions (see the arrows in FIG. 4) described previously. Consequently, the occurrence of distortion in a surface of wafer W caused by the adsorption of the three vertical movement pin units $34_1$, $34_2$ and $34_3$ is suppressed. Accordingly, even if wafer W is a large wafer such as a wafer with a diameter of 450 mm, wafer W can be stably supported from below by the three vertical movement pin units $34_1$, $34_2$ and $34_3$, and also it becomes possible to load the wafer W onto wafer holder WH almost without generating the distortion.

W can be stably supported from below by the three vertical movement pins 134, and also it becomes possible to load the wafer W onto wafer holder WH almost without generating the distortion.

Further, with exposure apparatus 100 related to the present embodiment, the exposure by a step-and-scan method is performed to wafer W that has been loaded onto wafer holder WH almost without generating the distortion. Accordingly, it becomes possible to transfer a pattern of reticle R onto each shot area on wafer W by accurately superposing the pattern on patterns that have been already formed.

Incidentally, center-up unit 80 equipped in wafer stage WST related to the embodiment described above can be modified in various manners as in a first modified example and a second modified example that will be described below. Wafer stages related to the modified examples will be described below, focusing on center-up units.

First Modified Example

Figure 11A:
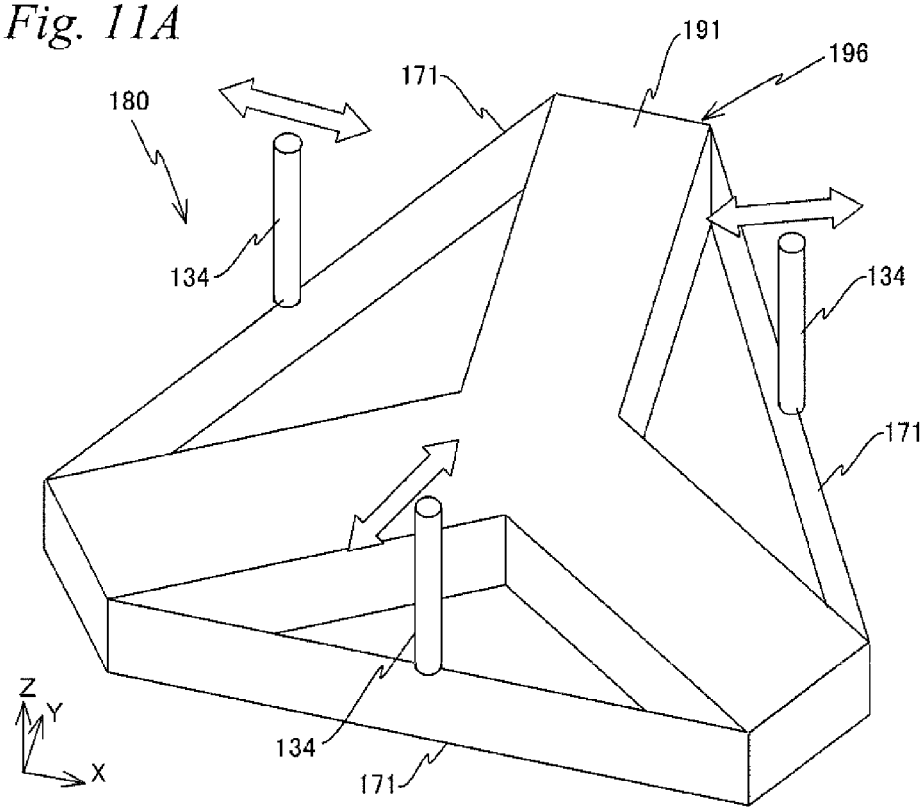
FIG. 11A is a perspective view showing a center-up unit related to a first modified example, with partial omission.
Figure 11B:
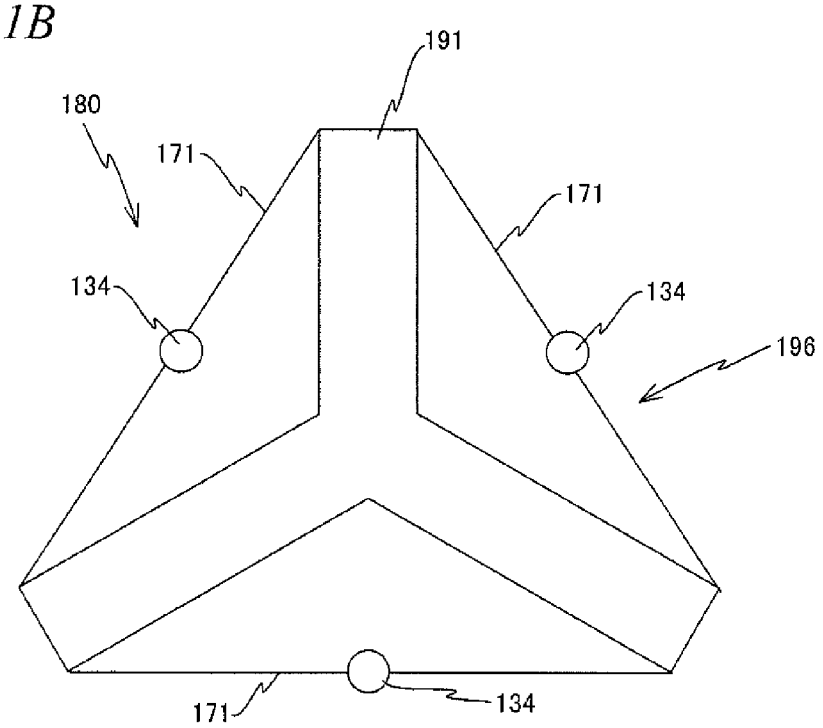
FIG. 11B is a plan view of the center-up unit shown in FIG. 11A.

FIG. 11A shows, in a perspective view, a center-up unit 180 equipped in a wafer stage related to the first modified example, except for drive axis 93 and drive mechanism 95, and FIG. 11B shows a plan view of center-up unit 180 shown in FIG. 11A.

Center-up unit 180 is equipped with three vertical movement pins 134 and a main body unit 196, instead of vertical movement pin units $34_1$ to $34_3$ and main body unit 96.

Main body unit 196 has a hexagonal shape, in a planar view (viewed from above (+Z direction)), that appears to be formed by truncating the vicinity of each of vertices of an equilateral triangle along a line parallel to a base that corresponds to each of the vertices, i.e., a hexagonal shape formed by connecting short sides and long sides alternately. Main body unit 196 includes: a base member 191 having a Y shape in a planar view that has three end surfaces that respectively configure the short sides of the foregoing hexagonal shape; and three plate springs 171 that interlink the end surfaces of base member 191 and respectively configure the long sides of the foregoing hexagonal shape. Base member 191 is made up of a Y-shaped member having three bar-shaped sections at intervals of the center angle of 120 degrees, and has the sufficient rigidity in directions of six degrees of freedom. Meanwhile, plate springs 171 are disposed to interlink the tips of the three bar-shaped sections of base member 191, and each have the lower rigidity only in a direction orthogonal to the interlinking direction in a planar view, compared with that in the other directions (e.g., plate spring 171 disposed on the −Y side has the lower rigidity in the Y-axis direction).

The three vertical movement pins 134 are fixed to the center portions of the three plate springs 171, respectively. Each of the three vertical movement pins 134 is made up of a cylindrical member having the sufficient rigidity in the directions of six degrees of freedom. Further, to each of the three vertical movement pins 134, a vacuum device such as a vacuum pump (now shown) is coupled via piping (not shown). By generating negative pressure in a space inside the three vertical movement pins 134, via the vacuum device (e.g., the vacuum pump) (not shown) in a state in which wafer W is supported from below by the three vertical movement pins 134, wafer W is adsorbed and held by the three vertical movement pins 134. In this adsorbed and held state, when the planarized correction is applied to wafer W, for example, and the force in a radial direction with the center of wafer W serving as the center acts from wafer W on the three vertical movement pins 134, each of the three vertical movement pins 134 is moved in a direction of the force (see double-headed arrows in FIG. 11A).

Also with wafer stage WST having center-up unit 180 related to the first modified example instead of center-up unit 80, the effect equivalent to exposure apparatus 100 of the embodiment described above can be obtained. That is, even in the case when the size of wafer W is increased, wafer W can be stably supported from below by the three vertical movement pins 134 of center-up unit 180, and also the occurrence of distortion of wafer W accompanying the adsorption holding by vertical movement pins 134, and thus the occurrence of distortion of wafer W after being loaded on the wafer holder can be suppressed or avoided.

Incidentally, in the embodiment and the first modified example described above, the center-up unit has three vertical movement members (the vertical movement pin units or the vertical movement pins). However, the center-up unit may have two, or four or more vertical movement members, and for example, may have six vertical movement members as in the second modified example that will be described below.

Second Modified Example

Figure 12:
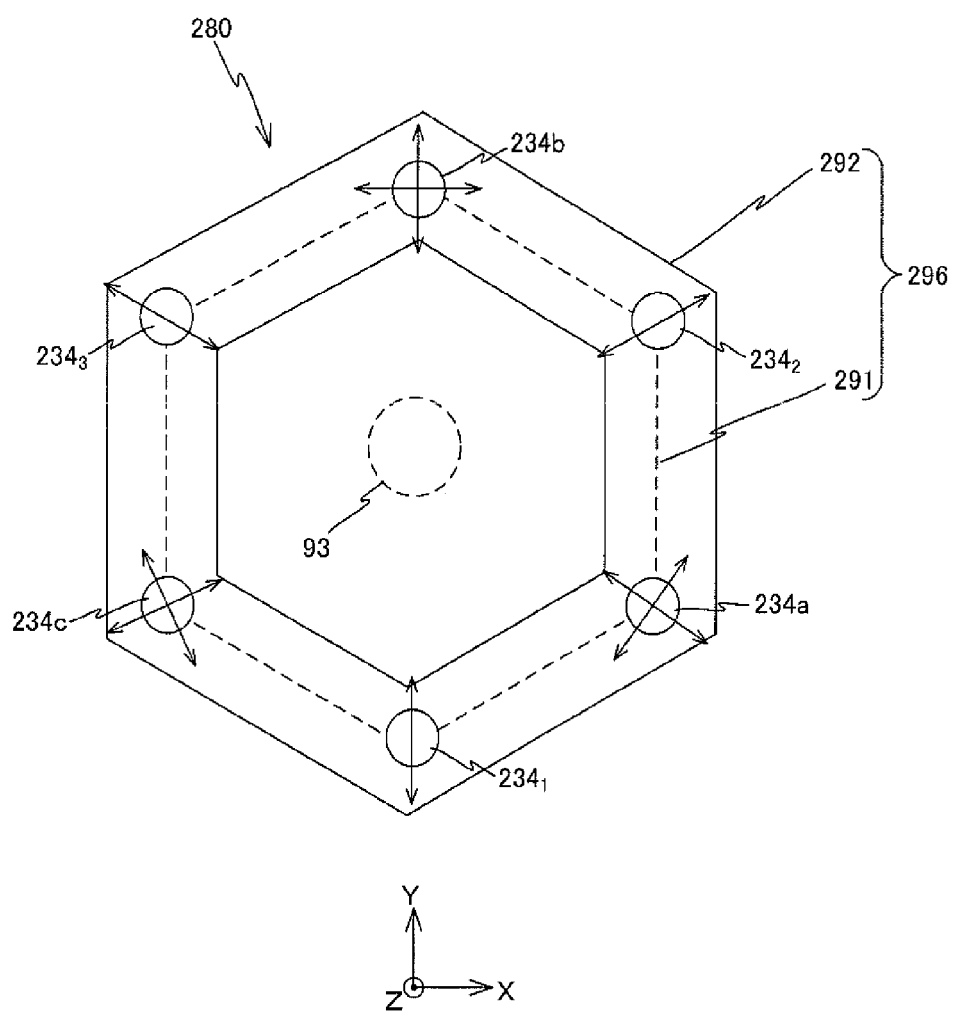
FIG. 12 is a plan view of a center-up unit related to a second modified example.

FIG. 12 shows a plan view of a center-up unit 280 equipped in a wafer stage related to the second modified example. Center-up unit 280 is equipped with a main body unit 296 fixed to the upper surface (the surface on the +Z side) of drive axis 93. Main body unit 296 is configured including a pedestal member 291 made up of a plate member having a regular hexagonal shape in a planar view, and a main body section 292 made up of a frame member having a regular hexagonal shape in a planar view that is fixed to the upper surface of pedestal member 291. Main body unit 296 has the functions similar to those of main body unit 96 described previously, while having the different shape from main body unit 96.

On the upper surface of main body section 292, the six (six units of) vertical movement pin units $234_1$, $234a$, $234_2$/$234b$, $234_3$ and $234c$ are attached to positions of the respective vertices of a regular hexagon.

Of the six vertical movement pin units, the three vertical movement pin units $234_1$, $234_2$ and $234_3$ installed at positions of the respective vertices of an equilateral triangle, including vertical movement pin unit $234_1$ positioned at the end portion on the −Y side in FIG. 12, are configured similarly to vertical movement pin unit $34_1$ and the like related to the embodiment described previously, and are attached to the upper surface of main body section 292 in a similar manner.

The remaining three vertical movement pin units 234a, 234b and 234c are installed on positions of the respective vertices of another equilateral triangle, and in each of these vertical movement pin units 234a, 234b and 234c, the structure is employed in which only the rigidity in the Z-axis direction is high and the rigidity in the other directions is low. For example, instead of plate spring 71 described previously, a spring member having a rod shape is employed to configure vertical movement pin units 234a, 234b and 234c, in a similar manner to vertical movement pin unit 34$_1$ and the like described previously. Consequently, the three vertical movement pin units 234a, 234b and 234c that have the high rigidity only in the Z-axis direction and the low rigidity in the other directions are realized.

At least the respective parts of the three vertical movement pin units 234$_1$, 234$_2$ and 234$_3$ including the pin heads (the adsorption sections) are displaced in a radial direction of a circumcircle of the regular hexagon described previously by the action of the force from a wafer at the time of the adsorption, and at least the respective parts of the remaining three vertical movement pin units 234a, 234b and 234c including the pin heads (the adsorption sections) are displaced in at least the radial direction and a tangential direction of the circumcircle.

Also with wafer stage WST having center-up unit 280 related to the second modified example instead of center-up unit 80, the effect equivalent to the embodiment described above can be obtained. That is, even in the case when the size of wafer W is increased, wafer W can be stably supported from below by the six vertical movement pin units of center-up unit 280, and also the occurrence of distortion of wafer W accompanying the adsorption holding by the vertical movement pin units, and thus the occurrence of distortion of wafer W after being loaded on the wafer holder can be suppressed or avoided. In this case, since wafer W is supported at six points, not only a 300 mm wafer but also a larger wafer such as a 450 mm wafer can be more stably supported.

Incidentally, while all the three vertical movement members have the same structure (including the shape) in the embodiment and the first modified example described previously, the structure of at least one vertical movement pin unit may be different from the other vertical movement pin units as long as wafer W can be kinematically supported from below. For example, a set of three vertical movement pin units that support a wafer on the principle similar to the so-called Kelvin clamp having the typical kinematic support structure may be employed. Herein, in the case when the total number of the degrees of freedom (the number of axes along which an object is freely movable)) and the number of physical constraint conditions that a support structure has is six, such a support structure is kinematic. This is the same as a state in which the imposed physical constraints are independent (have no redundancy).

Figure 13:
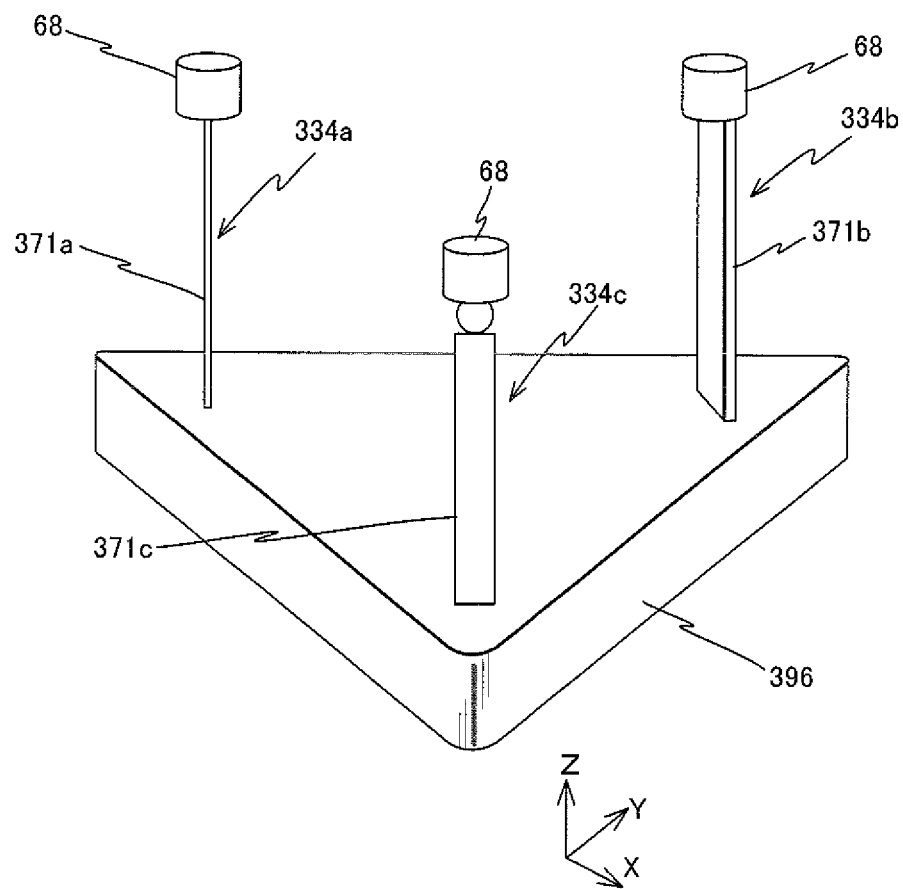
FIG. 13 is a view used to explain the configuration of vertical movement units that configure a center-up unit related to another modified example.

As an example of such a set of three vertical pin units, as shown in FIG. 13, a set of the following movement pin units can be given: a first vertical movement pin unit 334a including a bar-shaped spring member 371a that extends in a vertical direction, and has an upper end portion provided with an adsorption section 68 (such as the pin head in the embodiment described above) and a lower end portion fixed to a base member 396 that is vertically movable; a second vertical movement pin unit 334b including a plate spring member 371b that has an upper end portion provided with an adsorption section 68 and a lower end portion fixed to base member 396; and a third vertical movement pin unit 334c including a bar-shaped member 371c that has an upper end provided with an adsorption section 68 via a ball joint and a lower end fixed to base member 396. Herein, the normal direction (thin-wall direction) of the surface of plate spring member 371b is assumed to be parallel to the Y-axis, a direction connecting bar-shaped member 371c and plate spring member 371b is assumed to be parallel to the Y-axis. Incidentally, in this example, the lower end portion of bar-shaped spring member 371a serving as a displacement section, the lower end portion of plate spring member 371b as a displacement section, and the lower end portion of bar-shaped member 371c bear the respective lower ends of vertical movement pin units 334a, 334b and 334c.

In this case, in the first vertical movement pin unit 334a, only movement of adsorption section 68 in the Z-axis direction is constrained (the movement in the remaining five degrees of freedom is permitted), in the second vertical movement pin unit 334b, movement of adsorption section 68 in two axial directions (the Z-axis direction and the Y X axis direction) and rotation around the Y-axis (the θy rotation) are constrained (the movement in the Y-axis direction, and the θx rotation and the θz rotation are permitted), and in the third vertical movement pin unit 334c, only movement of adsorption section 68 in three orthogonal directions (the X-axis, Y-axis and Z-axis directions) is constrained (the θx, θy and θz rotations are permitted). However, in the case of adsorbing and holding a wafer with vertical movement pin units 334a to 334c, the position of the wafer in the three orthogonal directions is constrained by adsorption section 68 of the third vertical movement pin unit 334c, the rotation around the Y-axis (the θy rotation) and the rotation around the Z-axis (the θz rotation) are further constrained by adsorption section 68 of the second vertical movement pin unit 334b, and the rotation around the X-axis (the θx rotation) is further constrained by adsorption section 68 of the third vertical movement pin unit 334c.

Incidentally, while in the embodiment and modified examples described above (hereinafter, referred to as "the embodiment and the like described above"), all of three or six vertical movement pin units are displaced in at least one axis direction by the action of the force from the wafer, in a state of adsorbing and holding the wafer, the configuration is not limited thereto. That is, as long as the free change in shape of the wafer is not hindered, such a configuration may be employed that only some of the three or six vertical movement pin units are displaced by the action of the force from the wafer.

Incidentally, while in the embodiment and the like described above, the case has been described in which the exposure apparatus is a dry-type exposure apparatus that performs exposure of wafer W not via liquid (water), the type of the exposure apparatus is not limited thereto, and the embodiment and the like described above can also be applied to an exposure apparatus in which a liquid immersion space including an optical path of illumination light is formed between a projection optical system and a wafer and the wafer is exposed with the illumination light via the projection optical system and liquid of the liquid immersion space, as is disclosed in, for example, EP Patent Application Publication No. 1 420 298, PCT International Publication No. 2004/055803, U.S. Pat. No. 6,952,253 and the like.

Further, when wafer W is loaded onto wafer holder WH, the surface of rim section 28 and/or the surfaces of the plurality of pin sections 32 of wafer holder WH can be coated with a low frictional material (e.g., DLC (Diamond-like Carbon) and the like), in order to reduce the distortion that occurs in the wafer.

Further, while in the embodiment and the like described above, the case has been described in which the exposure apparatus is a scanning-type exposure apparatus of a step-and-scan method or the like, the exposure apparatus is not limited thereto, and a static-type exposure apparatus such as a stepper may be employed. Further, the embodiment described above can also be applied to a reduction projection exposure apparatus of a step-and-stick method in which a shot area and a shot area are synthesized, an exposure apparatus of a proximity method or a mirror projection aligner, or the like.

Further, the embodiment and the like described above can also be applied to a twin-stage-type exposure apparatus. The structure and the exposure operation of the twin-stage-type exposure apparatus are disclosed in, for example, U.S. Pat. No. 6,341,007, U.S. Pat. No. 6,400,441, U.S. Pat. No. 6,549,269, U.S. Pat. No. 6,590,634, U.S. Pat. No. 5,969,441 and U.S. Pat. No. 6,208,407, and the like. Further, the projection optical system in the exposure apparatus of the embodiment and the like described above is not limited to a reduction system but may be either of an equal magnifying system or a minifying system, and projection optical system PL is not limited a dioptric system but may be either of a catoptric system or a catadioptric system, and its projected image may be either of an inverted image or an erected image. Further, while the illumination area and the exposure area described previously each have a rectangular shape, the shapes are not limited thereto, and they may have, for example, an circular arc shape, a trapezoidal shape or a parallelogram shape, or the like.

Incidentally, the light source of the exposure apparatus of the embodiment and the like described above is not limited to the ArF excimer laser, but a pulsed laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm), or the like can also be used. Further, a harmonic wave generating device of a YAG laser or the like can also be used. Besides, for example, as is disclosed in U.S. Pat. No. 7,023,610, a harmonic wave, which is obtained by amplifying a single-wavelength laser beam in the infrared or visible range emitted by a DFB semiconductor laser or a fiber laser as vacuum ultraviolet light, with a fiber amplifier doped with, for example, erbium (or both erbium and ytterbium), and by converting the wavelength into ultraviolet light using a nonlinear optical crystal, may also be used.

Further, in the embodiment and the like described above, illumination light IL of the exposure apparatus is not limited to the light having a wavelength equal to or more than 100 nm, and it is needless to say that the light having a wavelength less than 100 nm may be used. For example, the embodiment described above can be applied to an EUV (Extreme Ultraviolet) exposure apparatus that uses an EUV light in a soft X-ray range (e.g., a wavelength range from 5 to 15 nm). In addition, the embodiment and the like described above can also be applied to an exposure apparatus that uses charged particle beams such as an electron beam or an ion beam.

Moreover, for example, as is disclosed in U.S. Pat. No. 6,611,316, the embodiment and the like described above can also be applied to an exposure apparatus that synthesizes two reticle patterns on a wafer via a projection optical system and almost simultaneously performs double exposure of one shot area on the wafer by one scanning exposure.

Incidentally, in the embodiment and the like described above, an object on which a pattern is to be formed (an object subject to exposure to which an energy beam is irradiated) is not limited to a wafer, but may be another object such as a glass plate, a ceramic substrate, a film member, or a mask blank.

The use of the exposure apparatus is not limited to the exposure apparatus used for manufacturing semiconductor devices. The embodiment and the like described above can be widely applied also to, for example, an exposure apparatus for manufacturing liquid crystal display devices which transfers a liquid crystal display device pattern onto a square-shaped glass plate, and to an exposure apparatus for manufacturing organic EL, thin-film magnetic heads, imaging devices (such as CCDs), micromachines, DNA chips and the like. Further, the embodiment and the like described above can also be applied to an exposure apparatus that transfers a circuit pattern onto a glass substrate or a silicon wafer not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Electronic devices such as semiconductor devices are manufactured through the steps such as: a step in which the function/performance design of a device is performed; a step in which a reticle based on the design step is manufactured; a step in which a wafer is manufactured using a silicon material; a lithography step in which a pattern of a mask (the reticle) is transferred onto the wafer with the exposure apparatus (a pattern forming apparatus) of the embodiment and the like described above and the exposure method thereof; a development step in which the wafer that has been exposed is developed; an etching step in which an exposed member of the other section than a section where resist remains is removed by etching; a resist removal step in which the resist that is no longer necessary when etching is completed is removed; a device assembly step (including a dicing process, a bonding process, and a packaging process); and an inspection step. In this case, in the lithography step, the exposure method described previously is implemented using the exposure apparatus of the embodiment and the like described above and a device pattern is formed on the wafer, and therefore, the devices with a high integration degree can be manufactured with high productivity.

Incidentally, the disclosures of all the publications, the PCT International Publications, the European Patent Application Publications, the U.S. Patent Application Publications and the U.S. Patents that are cited in the description so far and are related to exposure apparatuses and the like are each incorporated herein by reference.

REFERENCE SIGNS LIST $34_1$, $34_2$, $34_3$ . . . vertical movement pin units, 68 . . . adsorption section, $67_1$ to $67_3$ . . . flexible tubes, $68_1$ to $68_3$ . . . pin heads, 96 . . . main body unit, 71 . . . plate spring, 100 . . . exposure apparatus, 371a . . . bar-shaped spring member, 371b . . . plate spring member, 371c . . . bar-shaped member, light, IL . . . illumination light, IOP . . . illumination system, PL . . . projection optical system, PU . . . projection unit, W . . . wafer, WST . . . wafer stage, WMS . . . wafer holding area, WH . . . wafer holder.

The invention claimed is:

1. A substrate holding device that holds a substrate, the device comprising:
   a substrate holding section on which the substrate is adsorbed and held; and
   a plurality of movable members that each have an adsorption section to adsorb a rear surface of the substrate, at one end, the plurality of movable members being movable relative to the substrate holding section in a state of adsorbing the rear surface of the substrate with the adsorption sections, wherein
   at least one movable member of the plurality of movable members has at least part that is displaceable in at least one direction, by an action of a force received from the adsorbed substrate, the at least part including the adsorption section, the at least one direction including a direction for moving closer to a center of a substrate holding area of the substrate holding section.

2. A substrate holding device that holds a substrate, the device comprising:
   a substrate holding section on which the substrate is adsorbed and held; and
   a plurality of movable members that each have one end including an adsorption section to adsorb a rear surface of the substrate and the other end on an opposite side to the one end, the plurality of movable members being each movable relative to the substrate holding section in a state of adsorbing the rear surface of the substrate with the one end, wherein
   at least one movable member of the plurality of movable members is provided with a displacement section that is disposed between the one end and the other end and is displaceable in at least one direction by an action of a force received from the substrate, the at least one direction including a direction for moving closer to a center of a substrate holding area of the substrate holding section.

3. The substrate holding device according to claim 1, wherein
   at least three of the movable members are provided.

4. The substrate holding device according to claim 3, wherein
   each of the at least three movable members has at least part including the adsorption section that is displaced by the action of the force, and
   the at least part of the at least one movable member is displaced in a direction different from a direction in which the at least part of another movable members is displaced.

5. The substrate holding device according to claim 4, wherein
   at least respective parts of the plurality of movable members are displaced in directions different from each other by the action of the force, the at least respective parts each including the adsorption section.

6. The substrate holding device according to claim 1, wherein
   the respective movable members are disposed at positions of vertices of a regular polygon in a substrate holding area of the substrate holding section.

7. The substrate holding device according to claim 6, wherein
   at least part of each of the movable members is displaced in a radial direction of a circumcircle of the regular polygon by the action of the force, the at least part including the adsorption section.

8. The substrate holding device according to claim 7, wherein
   three of the movable members are provided.

9. The substrate holding device according to claim 7, wherein
   six of the movable members are provided, and
   of the six movable members, each of three movable members that are not adjacent to each other has at least part including the adsorption section that is displaced in a radial direction of the circumcircle by the action of the force, and each of the remaining three movable members has at least part including the adsorption section that is displaced in at least the radial direction and a tangential direction of the circumcircle.

10. The substrate holding device according to claim 1, wherein
    in the movable member that has at least part including the adsorption section displaced by the action of the force, the at least part is further turned around an axis that is orthogonal to an axis in a direction in which the at least part is displaced, by the action of the force.

11. The substrate holding device according to claim 1, wherein
    the plurality of movable members each have at least part that is displaced by receiving the action of the force, the at least part including the adsorption section, and
    the at least one direction further includes a direction for moving away from the center of the substrate holding area of the substrate section.

12. The substrate holding device according to claim 1, further comprising:
    a base member to which the other end of each of the plurality of movable members is fixed, and which moves integrally with the plurality of movable members, wherein
    the movable member having at least part including the adsorption section that is displaced by the action of the force includes
    the adsorption section,
    a spring member that has one end portion provided with the adsorption section and the other end portion fixed to the base member, and
    an annular member that is bendable freely and surrounds the spring member entirely along a longitudinal direction of the spring member.

13. The substrate holding device according to claim 8, further comprising:
    a base member to which the other end of each of the three movable members is fixed, and which moves integrally with the three movable members, wherein
    the three movable members each include
    (i) a bar-shaped spring member having one end portion provided with the adsorption section and the other end portion fixed to the base member,
    (ii) a plate spring member having one end portion provided with the adsorption section and the other end portion fixed to the base member, and
    (iii) a bar-shaped member having one end portion provided with the adsorption section that is displaceable and the other end portion fixed to the base member.

14. The substrate holding device according to claim 1, wherein
    the at least part that includes the adsorption section adsorbing the substrate is displaceable in the at least one direction so that a change in shape of the substrate is not prevented, the change in shape occurring when the substrate is mounted on a substrate holding area of the substrate holding section.

15. An exposure apparatus that exposes a substrate with an energy beam, the apparatus comprising:
the substrate holding device according to claim 1, that holds the substrate on the substrate holding section; and
a pattern generating device that generates a pattern on the substrate by exposing the substrate with the energy beam.

16. A device manufacturing method, including:
exposing a substrate using the exposure apparatus according to claim 15; and
developing the substrate that has been exposed.

17. The substrate holding device according to claim 2, wherein
at least three of the movable members are provided.

18. The substrate holding device according to claim 17, wherein
each of the at least three movable members has at least part including the adsorption section that is displaced by the action of the force, and
at least part of the at least one movable member is displaced in a direction different from a direction in which the at least part of another movable members is displaced.

19. The substrate holding device according to claim 18, wherein
at least respective parts of the plurality of movable members are displaced in directions different from each other by the action of the force, the at least respective parts each including the adsorption section.

20. The substrate holding device according to claim 2, wherein
the respective movable members are disposed at positions of vertices of a regular polygon in a substrate holding area of the substrate holding section.

21. The substrate holding device according to claim 20, wherein
at least part of each of the movable members is displaced in a radial direction of a circumcircle of the regular polygon by the action of the force, the at least part including the adsorption section.

22. The substrate holding device according to claim 21, wherein
three of the movable members are provided.

23. The substrate holding device according to claim 21, wherein
six of the movable members are provided, and
of the six movable members, each of three movable members that are not adjacent to each other has at least part including the adsorption section that is displaced in a radial direction of the circumcircle by the action of the force, and each of the remaining three movable members has at least part including the adsorption section that is displaced in at least the radial direction and a tangential direction of the circumcircle.

24. The substrate holding device according to claim 2, wherein
in the movable member that has at least part including the adsorption section displaced by the action of the force, the at least part is further turned around an axis that is orthogonal to an axis in a direction in which the at least part is displaced, by the action of the force.

25. The substrate holding device according to claim 2, wherein
the plurality of movable members each have at least part that is displaced by receiving the action of the force, the at least part including the adsorption section, and
the at least one direction further includes a direction for moving away from the center of the substrate holding area of the substrate holding section.

26. The substrate holding device according to claim 2, further comprising:
a base member to which the other end of each of the plurality of movable members is fixed, and which moves integrally with the plurality of movable members, wherein
the movable member having at least part including the adsorption section that is displaced by the action of the force includes
the adsorption section,
a spring member that has one end portion provided with the adsorption section and the other end portion fixed to the base member, and
an annular member that is bendable freely and surrounds the spring member entirely along a longitudinal direction of the spring member.

27. The substrate holding device according to claim 22, further comprising:
a base member to which the other end of each of the three movable members is fixed, and which moves integrally with the three movable members, wherein
the three movable members each include
(i) a bar-shaped spring member having one end portion provided with the adsorption section and the other end portion fixed to the base member,
(ii) a plate spring member having one end portion provided with the adsorption section and the other end portion fixed to the base member, and
(iii) a bar-shaped member having one end portion provided with the adsorption section that is displaceable and the other end portion fixed to the base member.

28. The substrate holding device according to claim 2, wherein
the at least part that includes the adsorption section adsorbing the substrate is displaceable in the at least one direction so that a change in shape of the substrate is not prevented, the change in shape occurring when the substrate is mounted on a substrate holding area of the substrate holding section.

29. An exposure apparatus that exposes a substrate with an energy beam, the apparatus comprising:
the substrate holding device according to claim 2, that holds the substrate on the substrate holding section; and
a pattern generating device that generates a pattern on the substrate by exposing the substrate with the energy beam.

30. A device manufacturing method, including:
exposing a substrate using the exposure apparatus according to claim 29; and
developing the substrate that has been exposed.

* * * * *